(12) United States Patent
Kwon

(10) Patent No.: US 11,580,393 B2
(45) Date of Patent: Feb. 14, 2023

(54) METHOD AND APPARATUS WITH NEURAL NETWORK DATA INPUT AND OUTPUT CONTROL

(71) Applicant: SAMSUNG ELECTRONICS CO., LTD., Suwon-si (KR)

(72) Inventor: Hyung-Dal Kwon, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 293 days.

(21) Appl. No.: 16/900,007

(22) Filed: Jun. 12, 2020

(65) Prior Publication Data

US 2021/0201133 A1 Jul. 1, 2021

(30) Foreign Application Priority Data

Dec. 27, 2019 (KR) .......................... 10-2019-0176097

(51) Int. Cl.
*G06N 3/08* (2006.01)
*G06N 3/04* (2023.01)
*H03M 7/30* (2006.01)

(52) U.S. Cl.
CPC ................ *G06N 3/08* (2013.01); *G06N 3/04* (2013.01); *H03M 7/30* (2013.01)

(58) Field of Classification Search
CPC ............ G06N 3/08; G06N 3/04; G06N 3/063; G06N 3/082; H03M 7/30; G06F 12/0802; G06K 9/6256
See application file for complete search history.

(56) References Cited

U.S. PATENT DOCUMENTS 10,229,356 B1 * 3/2019 Liu .......................... G10L 15/16
2018/0032867 A1 2/2018 Son et al.
(Continued)

FOREIGN PATENT DOCUMENTS

KR 10-2014-0129067 A 11/2014
KR 10-2016-0076533 A 6/2016
(Continued)

OTHER PUBLICATIONS

EESR dated Mar. 30, 2021 issued in counterpart European Patent Application No. 20195045.8 (9 pages in English).
(Continued)

*Primary Examiner* — Jean B Jeanglaude
(74) *Attorney, Agent, or Firm* — NSIP Law

(57) ABSTRACT

A neural network deep learning data control apparatus includes: a memory; an encoding circuit configured to receive a data sequence, generate a compressed data sequence in which consecutive invalid bits in a bit string of the data sequence are compressed into a single bit of the compressed data sequence, generate a validity determination sequence indicating a valid bit and an invalid bit in a bit string of the compressed data sequence, and write the compressed data sequence and the validity determination sequence to the memory; and a decoding circuit configured to read the compressed data sequence and the validity determination sequence from the memory, and determine a bit in the bit string of the compressed data sequence set for transmission to a neural network circuit, based on the validity determination sequence, such that the neural network circuit omits an operation with respect to non-consecutive invalid bits.

36 Claims, 17 Drawing Sheets

(56) References Cited

U.S. PATENT DOCUMENTS

| | | |
|---|---|---|
| 2018/0046916 A1* | 2/2018 | Dally .................... G06N 3/063 |
| 2018/0189981 A1 | 7/2018 | Singh et al. |
| 2019/0041961 A1 | 2/2019 | Desai et al. |
| 2019/0258932 A1 | 8/2019 | Kang et al. |

FOREIGN PATENT DOCUMENTS

| | | |
|---|---|---|
| KR | 10-2017-0135752 A | 12/2017 |
| KR | 10-2018-0050928 A | 5/2018 |
| KR | 10-2019-0062129 A | 6/2019 |
| KR | 10-2019-0078292 A | 7/2019 |
| KR | 10-2019-0098107 A | 8/2019 |
| KR | 10-2019-0099930 A | 8/2019 |
| WO | WO 2019/164250 A1 | 8/2018 |

OTHER PUBLICATIONS

Moons, Bert, et al. "14.5 envision: A 0.26-to-10tops/w Subword-Parallel Dynamic-Voltage-Accuracy-Frequency-Scalable Convolutional Neural Network Processor in 28nm FDSOI." 2017 *IEEE International Solid-State Circuits Conference (ISSCC). IEEE*, 2017 (4 Pages in English).

Chen, Yu-Hsin, et al. "Eyeriss: An Energy-Efficient Reconfigurable Accelerator for Deep Convolutional Neural Networks." *IEEE journal of solid-state circuits*, vol. 52, Issue 1, 2016 (pp. 127-138).

* cited by examiner

610

| 1 | 1 | 9 | 1 | 8 | 1 | 7 | 1 | 6 |
|---|---|---|---|---|---|---|---|---|
| 0 | 0 | 1 | 0 | 1 | 0 | 1 | 0 | 1 |
| W | N | C |   |   |   |   |   |   |

| 2 | JP |
|---|-----|
| 8 | Value |
| 0 | CG |

620

| 10 | 1 | 9 | 1 | 8 | 1 | 7 | 1 | 6 |
|----|---|---|---|---|---|---|---|---|
| 1  | 0 | 1 | 0 | 1 | 0 | 1 | 0 | 1 |
| N  | C |   |   |   |   |   |   | W |

| 2 | JP |
|---|-----|
| 9 | Value |
| 0 | CG |

630

| 10 | 1 | 9 | 1 | 8 | 1 | 7 | 1 | 1 |
|----|---|---|---|---|---|---|---|---|
| 1  | 0 | 1 | 0 | 1 | 0 | 1 | 0 | 0 |
| C  |   |   |   |   |   |   | W | N |

| 1 | JP |
|---|-----|
| 9 | Value |
| 1 | CG |

FIG. 6

METHOD AND APPARATUS WITH NEURAL NETWORK DATA INPUT AND OUTPUT CONTROL

CROSS-REFERENCE TO RELATED APPLICATIONS

This application claims the benefit under 35 USC § 119(a) of Korean Patent Application No. 10-2019-0176097 filed on Dec. 27, 2019 in the Korean Intellectual Property Office, the entire disclosure of which is incorporated herein by reference for all purposes.

BACKGROUND

1. Field

The following description relates to a method and apparatus with neural network data input and output control.

2. Description of Related Art

An artificial intelligence (AI) system may be a computer system that enables a machine to learn and judge and become smart, unlike conventional rule-based smart systems. As used more, the AI system may have an improved recognition rate and may more accurately understand a preference of a user.

AI technology may include machine learning (e.g., deep learning) and element techniques that utilize machine learning. Machine learning may be an algorithm technology that classifies/learns features of input data, and the element techniques may be techniques that implement functions (such as, cognition and judgment) by using machine learning algorithms such as deep learning, and may be implemented in technical fields such as linguistic understanding, visual understanding, inference/prediction, knowledge representation, and motion control.

Artificial intelligence technology may be applied to various fields as follows. Linguistic understanding may be a technique of recognizing and applying/processing language/characters, and may include natural language processing, machine translation, dialogue system, question and answer, and speech recognition/synthesis. Visual understanding may be a technique of recognizing and processing objects like vision, and may include object recognition, object tracking, image retrieval, person recognition, scene understanding, spatial understanding, and image enhancement. Inference/prediction may be a technique of judging information and performing logical inference and prediction, and may include knowledge/probability-based inference, optimization prediction, preference-based planning, and recommendation. Knowledge representation may be a technique of automatically processing human experience information into knowledge data, and may include knowledge construction (data generation/classification) and knowledge management (data utilization). Motion control may be a technique of controlling autonomous driving of a vehicle and movement of a robot, as a non-limiting example, and may include movement control (navigation, collision, driving) and operation control (action control), for example.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a neural network deep learning data control apparatus includes: a memory; an encoding circuit configured to receive a data sequence, generate a compressed data sequence in which consecutive invalid bits in a bit string of the data sequence are compressed into a single bit of the compressed data sequence, generate a validity determination sequence indicating a valid bit and an invalid bit in a bit string of the compressed data sequence, and write the compressed data sequence and the validity determination sequence to the memory; and a decoding circuit configured to read the compressed data sequence and the validity determination sequence from the memory, and determine a bit in the bit string of the compressed data sequence set for transmission to a neural network circuit, based on the validity determination sequence, such that the neural network circuit omits an operation with respect to non-consecutive invalid bits.

The single bit of the compressed data sequence may indicate a number of the consecutive invalid bits in the bit string of the data sequence.

The decoding circuit may include a buffer configured to sequentially store the compressed data sequence and the validity determination sequence, and the decoding circuit may be configured to store a first pointer indicating a location at which a current bit of the compressed data sequence to be transmitted to the neural network circuit is stored in the buffer, and a second pointer indicating a location at which a next bit of the compressed data sequence to be transmitted to the neural network circuit at a next cycle of the current bit is stored in the buffer.

For the determining of the bit set for transmission to the neural network circuit, the decoding circuit may be configured to: determine whether the current bit corresponding to the first pointer is valid based on the validity determination sequence; skip transmitting the current bit to the neural network circuit in response to the current bit being invalid; and transmit the current bit to the neural network circuit in response to the current bit being valid.

The decoding circuit may be configured to: determine whether the next bit corresponding to the second pointer is valid based on the validity determination sequence; move the first pointer to the location at which the next bit is stored in the buffer in response to the next bit being valid; and move the first pointer to a location at which a bit to be transmitted to the neural network circuit at a next cycle of the next bit is stored in the buffer in response to the next bit being invalid.

The decoding circuit may be configured to: determine whether the next bit corresponding to the second pointer is valid based on the validity determination sequence; move the second pointer to a location at which a bit to be transmitted to the neural network circuit at a next cycle of the next bit is stored in the buffer in response to the next bit being valid; and move the second pointer to a location at which a bit to be transmitted to the neural network circuit at an after-next cycle of the next bit is stored in the buffer in response to the next bit being invalid.

The decoding circuit may be configured to determine to jump an operation processing of the neural network circuit based on the validity determination sequence.

The decoding circuit may be configured to determine whether to jump an operation processing of the neural network circuit based on the next bit corresponding to the second pointer.

The decoding circuit may be configured to: determine whether the next bit corresponding to the second pointer is valid based on the validity determination sequence; skip jumping an operation processing of the neural network circuit in response to the next bit being valid; and jump the operation processing of the neural network circuit in response to the next bit being invalid.

The decoding circuit may be configured to jump the operation processing of the neural network circuit by a bit value of the next bit in response to the next bit being invalid.

The decoding circuit may be configured to jump the operation processing of the neural network circuit by a value obtaining by adding a value of 1 to a bit value of the next bit, in response to the next bit being invalid.

The decoding circuit may be configured to store a third pointer indicating a location at which the compressed data sequence and the validity determination sequence are to be stored in the buffer.

The valid bit may be a bit having a bit value greater than a predetermined threshold value, and the invalid bit is a bit having a bit value less than or equal to the predetermined threshold value.

A bit value at a location in the validity determination sequence corresponding to a location of a valid bit in the compressed data sequence may "1", and a bit value at a location in the validity determination sequence corresponding to a location of an invalid bit in the compressed data sequence may be "0".

The decoding circuit may be configured to use the validity determination sequence as a clock gating signal to perform an operation of the neural network circuit.

The buffer may include a ring buffer.

The encoding circuit may be configured to generate the compressed data sequence by compressing consecutive valid bits having the same bit value in the bit string of the data sequence into another single bit of the compressed data sequence.

The decoding circuit may be configured to store a fourth pointer for identifying a plurality of reused data in response to the data sequence including the plurality of reused data.

The decoding circuit may be configured to add a bit for a plurality of compressed data sequences to have a same length, when reading the plurality of compressed data sequences in parallel.

The data sequence may indicate connection strengths of edges between nodes of a neural network of the neural network circuit.

The apparatus may include the neural network circuit, wherein the neural network circuit is configured to train the neural network by redetermining one or more of the connection strengths for a dropout operation, in response to receiving the determined bit string of the compressed data sequence.

In another general aspect, a processor-implemented neural network deep learning data control method includes: receiving a data sequence; generating a compressed data sequence in which consecutive invalid bits in a bit string of the data sequence are compressed into a single bit of the compressed data sequence; generating a validity determination sequence to determine a valid bit and an invalid bit in a bit string of the compressed data sequence; writing the compressed data sequence and the validity determination sequence to a memory; reading the compressed data sequence and the validity determination sequence from the memory; and determining a bit in the bit string of the compressed data sequence set for transmission to a neural network circuit, based on the validity determination sequence, such that the neural network circuit omits an operation with respect to non-consecutive invalid bits.

The single bit of the compressed data sequence may indicate a number of the consecutive invalid bits in the bit string of the data sequence.

The method may include: sequentially storing the compressed data sequence and the validity determination sequence; and storing a first pointer indicating a location at which a current bit of the compressed data sequence to be transmitted to the neural network circuit is stored in the buffer, and a second pointer indicating a location at which a next bit of the compressed data sequence to be transmitted to the neural network circuit at a next cycle of the current bit is stored in the buffer.

The determining may include: determining whether the current bit corresponding to the first pointer is valid based on the validity determination sequence; skipping transmitting the current bit to the neural network circuit in response to the current bit being invalid; and transmitting the current bit to the neural network circuit in response to the current bit being valid.

The method may include: determining whether the next bit corresponding to the second pointer is valid based on the validity determination sequence; moving the first pointer to the location at which the next bit is stored in the buffer in response to the next bit being valid; and moving the first pointer to a location at which a bit to be transmitted to the neural network circuit at a next cycle of the next bit is stored in the buffer in response to the next bit being invalid.

The method may include: determining whether the next bit corresponding to the second pointer is valid based on the validity determination sequence; moving the second pointer to a location at which a bit to be transmitted to the neural network circuit at a next cycle of the next bit is stored in the buffer in response to the next bit being valid; and moving the second pointer to a location at which a bit to be transmitted to the neural network circuit at an after-next cycle of the next bit is stored in the buffer in response to the next bit being invalid.

The method may include determining whether to jump an operation processing of the neural network circuit based on the next bit corresponding to the second pointer.

The method may include: determining whether the next bit corresponding to the second pointer is valid based on the validity determination sequence; skipping jumping an operation processing of the neural network circuit in response to the next bit being valid; and jumping the operation processing of the neural network circuit in response to the next bit being invalid.

The jumping may include jumping the operation processing of the neural network circuit by a bit value of the next bit in response to the next bit being invalid.

The method may include storing a third pointer indicating a location at which the compressed data sequence and the validity determination sequence are to be stored in the buffer.

The generating may include generating the compressed data sequence by compressing consecutive valid bits having the same bit value in the bit string of the data sequence into another single bit of the compressed data sequence.

The method may include storing a fourth pointer for identifying a plurality of reused data in response to the data sequence including the plurality of reused data.

The method may include adding a bit for a plurality of compressed data sequences to have a same length, when reading the plurality of compressed data sequences in parallel.

A non-transitory computer-readable storage medium may store instructions that, when executed by a processor, configure the processor to perform the method.

In another general aspect, a processor-implemented neural network data control method includes: receiving a data sequence indicating connection strengths of connections between nodes of a neural network; generating a compressed data sequence comprising a bit of the data sequence that is greater than a threshold and a bit having a value determined based on a number of consecutive bits of the data sequence that are less than or equal to the threshold; and training the neural network by performing a dropout operation of the one or more connections based on the compressed data sequence.

Other features and aspects will be apparent from the following detailed description, the drawings, and the claims.

BRIEF DESCRIPTION OF THE DRAWINGS

FIG. 6 illustrates an example of zero gating.

Figure 1A:
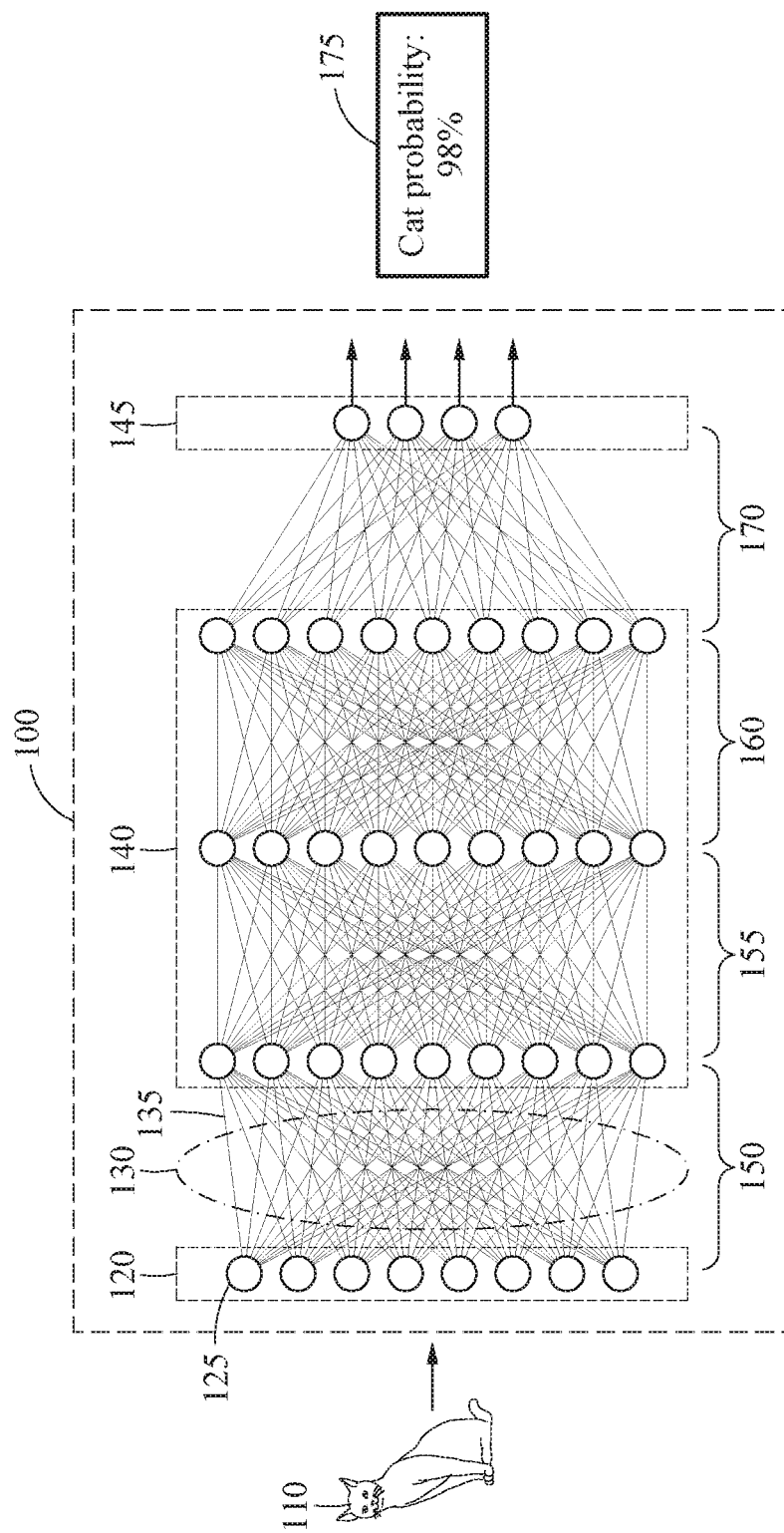
FIG. 1A illustrates an example of a method of training a neural network.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

Although terms of "first" or "second" are used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

As used herein, the singular forms are intended to include the plural forms as well, unless the context clearly indicates otherwise. The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all examples are not limited thereto.

The examples may be implemented as, or with, various types of products such as, for example, a personal computer, a laptop computer, a tablet computer, a smart phone, a television, a smart home appliance, an intelligent vehicle, a kiosk, and a wearable device. Hereinafter, the examples will be described in detail with reference to the accompanying drawings, wherein like drawing reference numerals are used for like elements.

FIG. 1A illustrates an example of a method of training a neural network.

Referring to FIG. 1A, a neural network 100 may include an input layer 120, hidden layers 140, and an output layer 145. In FIG. 1A, the neural network 100 may be a fully connected network that classifies and outputs information included in input data is illustrated. In detail, if the input data is image data, the neural network 100 may output, as output data, result data obtained by classifying types of image objects included in the image data.

The plurality of layers forming the neural network 100 may each include a plurality of nodes (for example, nodes 125) that receive data. Two neighboring layers may be connected by a plurality of edges or connections (for example, edges 130) as shown in FIG. 1A. Each of the nodes may include a weight, and the neural network 100 may determine the output data based on a value determined by performing an operation (for example, a multiplication operation) between an input signal and the weight.

Referring to FIG. 1A, the input layer 120 may receive the input data, for example, input data 110 including a cat as an image object.

Further, the neural network 100 may include a first edge layer 150 formed between the input layer 120 and a first hidden layer, a second edge layer 155 formed between the first hidden layer and a second hidden layer, a third edge layer 160 formed between the second hidden layer and a third hidden layer, and a fourth edge layer 170 formed between the third hidden layer and the output layer 145.

The plurality of nodes included in the input layer 120 of the neural network 100 may receive signals corresponding to the input data 110. Through the operations at the plurality of layers included in the hidden layers 140, the output layer 145 may output output data 175 corresponding to the image data 110. In an example of FIG. 1A, the neural network 100 may output the output data 175 of "Cat probability: 98%" by performing operations to classify types of image objects included in an input image. To increase the accuracy of the output data 175 output from the neural network 100, weights may be corrected to increase the accuracy of output data by performing learning or training in a direction from the output layer 145 to the input layer 120 (e.g., through one or more learning techniques such as backpropagation of non-dropped out remaining nodes of a neural network).

As described above, the neural network 100 may adjust connection weights of one or more nodes in a layer through learning. In an example, overfitting may occur during the process of adjusting the weights. Overfitting may refer to a situation in which the output accuracy with respect to newly input data decreases due to excessive concentration on training data. To solve such overfitting issues, an operation using dropout or pruning may be used. The operation such as dropout or pruning may be a technique that improves the learning performance by omitting operations (e.g., operations determined to be unnecessary) in a neural network.

Figure 1B:
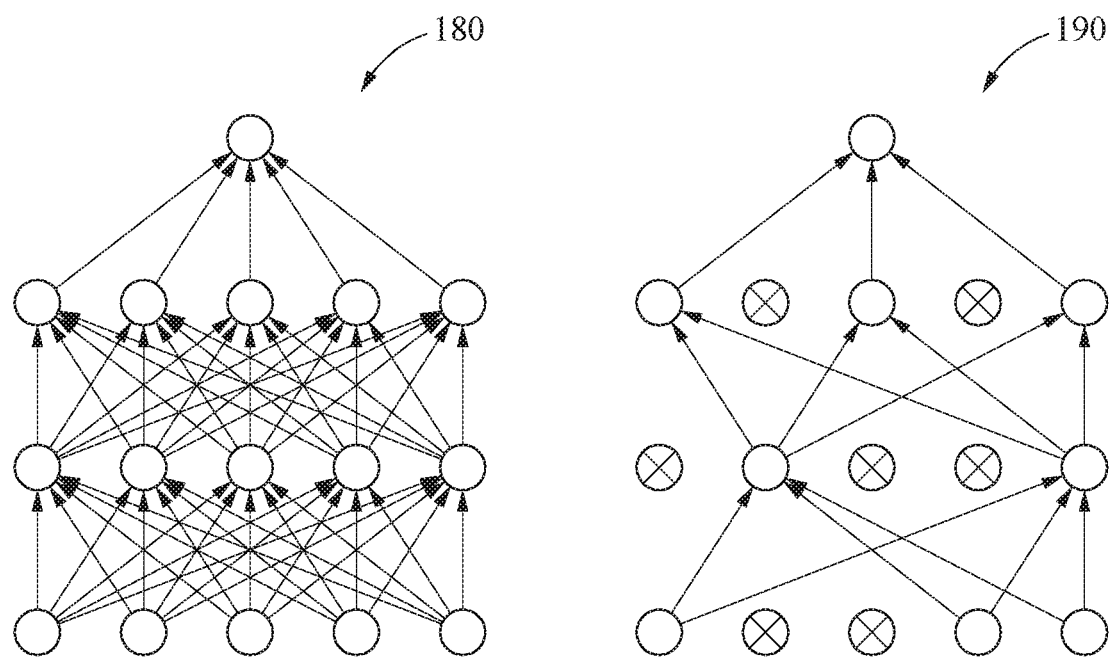
FIG. 1B illustrates an example of omitting an operation in a neural network to improve the learning performance.

FIG. 1B illustrates an example of omitting an operation (e.g., an operation determined to be unnecessary) in a neural network to improve the learning performance.

Referring to FIG. 1B, a fully connected neural network 180 and a partially connected neural network 190 are illustrated. The partially connected neural network 190 may have fewer nodes and fewer edges than the fully connected neural network 180. For example, the partially connected neural network 190 may be a network to which dropout is applied.

A model combination may be used to improve the learning performance of the fully connected neural network 180. For the model combination, training may be performed using different training data, or models may have different structures. However, when deep networks are used, training one or more networks to accurately estimate, interpret, or classify different types of image objects may include training a plurality of networks (e.g., wherein each of the networks is trained based on a respective type of image object), which may include performing a large amount of computation. To reduce the amount of computation performed to train one or more networks to accurately classify different types of image objects, dropout may omit a portion of neurons at random during a learning cycle of a network, rather than training the plurality of networks. In this example, training a network using dropout configures the network to accurately classify different types of image objects, such as training exponentially various models, as many as combinations of the omitted neurons is produced, and thus the effect of model combination is achieved.

Referring to FIG. 1B, the partially connected neural network 190 may have fewer edges than the fully connected neural network 180. Thus, the partially connected neural network 190 may include multiple bit values of "0" indicating "disconnection" in an edge sequence indicating connections among nodes.

Hereinafter, practical methods of omitting operations (e.g., operations determined to be unnecessary) in the neural network operation will be described in detail. According to one or more embodiments of the present disclosure, multiplication of a matrix and a vector used in the operation process of a neural network (for example, a fully connected network) may be performed quickly at low power.

Figure 2:
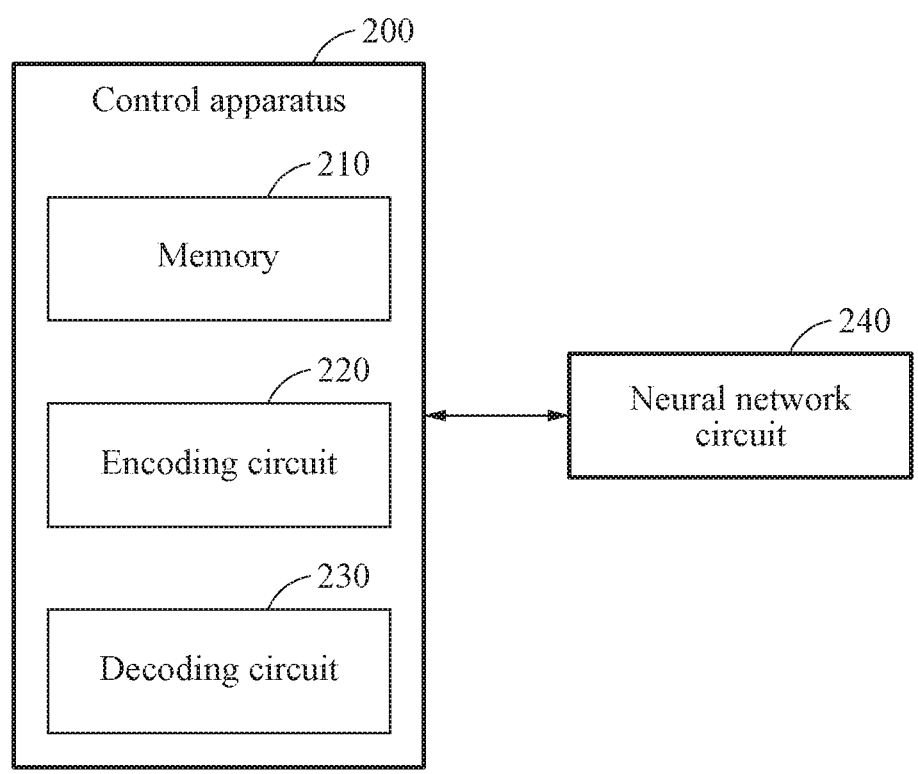
FIG. 2 illustrates an example of a control apparatus.

FIG. 2 illustrates an example of a control apparatus.

Referring to FIG. 2, a control apparatus 200 may include a memory 210, an encoding circuit 220, and a decoding circuit 230. The control apparatus 200 may be connected to a neural network circuit 240 that performs a deep learning operation of a neural network. The control apparatus 200 may receive information output during the operation process of the neural network circuit 240 and transmit the information generated by the control apparatus 200 to the neural network circuit 240.

The neural network circuit 240 may perform operations through the neural network including an input layer, a hidden layer, and an output layer. Here, the hidden layer may include a plurality of layers, for example, a first layer, a second layer, and a third layer. Non-limiting example operations of the neural network performed by the neural network circuit 240 are described above with reference to FIGS. 1A through 1B.

The control apparatus 200 may receive data from the neural network circuit 240 and output data to the neural network circuit 240 in a first-in, first-out (FIFO) manner. The neural network circuit 240 may process information in a unit of each layer of the neural network. In an example, there may be a waiting time for each layer during the information processing process of the neural network circuit 240. For example, a result of an operation of the first layer may be processed or reprocessed for a predetermined waiting time after the operation of the first layer. The process of processing or reprocessing the operation result may be performed through the control apparatus 200. The control apparatus 200 may process the operation result of the first layer and transmits the processed operation result to the neural network circuit 240. The processed operation result received by the neural network circuit 240 from the control apparatus 200 may be used for an operation of the second layer. The control apparatus 200 may sequentially receive data from the neural network circuit 240 and sequentially output processed data to the neural network circuit 240.

The neural network circuit 240 may perform the operations of the neural network. For example, the neural network may be a fully connected network. Nodes included in each layer of the fully connected network may have weights. In the fully connected network, a signal input to a current layer may be output (e.g., to a subsequent layer) after an operation with a weight matrix (for example, a multiplication operation). Here, the signal input into the current layer may be matrix data in the size of N×1 (N denoting the number of nodes of the current layer). Further, a weight matrix multiplied by the signal input into the current layer may be matrix data in the size of M×N (M denoting the number of nodes of a layer subsequent to the current layer; N denoting the number of nodes of the current layer). A signal output from the current layer may be input into the subsequent layer. Here, the signal output from the current layer may be input into the subsequent layer through the control by the control apparatus 200. For example, the signal output from the current layer may be processed by the control apparatus 200 and the processed signal may be input into the subsequent layer.

The memory 210 may store a sequence or a bitstream having a predetermined size.

The sequence may be a sequence including information related to an input feature map and/or a sequence including information related to a weight of a filter.

For example, the sequence may include information regarding whether nodes constituting a plurality of layers of the neural network are connected by edges. In detail, the sequence may include information indicating connections or disconnections of a plurality of edges formed in a layer included in the neural network. For example, referring to FIG. 1A, the sequence may include information related to an edge sequence indicating connections of the plurality of edges 130 included in a predetermined layer, for example, the first layer 150.

A bit value of each bit string of the sequence may indicate a connection strength of a predetermined edge. For example, a greater bit value may indicate a higher connection strength of a predetermined edge, and a smaller bit value may indicate a lower connection strength of the predetermined edge. Hereinafter, information, as a sequence, indicating connection strengths of predetermined edges may be referred to as a "data sequence".

The sequence may include information related to a sequence that distinguishes a valid bit and an invalid bit in a bit string of the data sequence. For example, a value "0" included in the bit string of the sequence may indicate that a bit corresponding to an address of a corresponding bit in the data sequence is an invalid bit. Further, a value "1" included in the bit string of the sequence may indicate that a bit corresponding to an address of a corresponding bit in the data sequence is a valid bit. Whether a bit in the data sequence is valid or invalid may be determined by comparing a size of the bit to a predetermined threshold value. Hereinafter, a sequence that determines a valid bit and an invalid bit in the bit string of the data sequence may be referred to as a "validity determination sequence".

The memory 210 may store the data sequence and/or the validity determination sequence described above. The data sequence may be compressed and stored in the memory 210 in the form of a compressed data sequence. Non-limiting examples of the data sequence, the compressed data sequence, and the validity determination sequence will be described in detail later with reference to FIG. 3A.

When the neural network circuit 240 terminates or completes an operation of a predetermined layer, the control apparatus 200 may receive an operation result of the layer from the neural network circuit 240. In an example, the operation result for the layer may be a data sequence for the layer.

The encoding circuit 220 may process the data sequence received by the control apparatus 200 and store the processed data sequence in the memory 210. For example, the processed sequence may be a compressed sequence obtained by compressing the data sequence. Further, for example, the processed sequence may be a validity determination sequence that distinguishes a valid bit and an invalid bit in a bit string of the compressed data sequence. The encoding circuit 220 may generate a processed sequence corresponding to an operation cycle of the neural network circuit 240. The encoding circuit 220 may write the processed sequence to the memory 210. The compressed sequence may include fewer bit strings than a sequence before compression, and thus the encoding circuit 220 may reduce the number of writes to the memory 210. Thus, due to the reduction in the number of writes, the power consumption of the control apparatus 200 may be advantageously reduced by the control apparatus 200 of one or more embodiments. Accordingly, the control apparatus 200 of one or more embodiments may improve the technical field of neural network training by reducing power consumption used by the control apparatus 200 to train a neural network through dropout, compared to a typical control apparatus.

The decoding circuit 230 may transmit the processed sequence generated by the encoding circuit 220 to the neural network circuit 240, such that the neural network circuit 240 may determine (or redetermine) a connection state (e.g., a connection strength) of an edge in the neural network. The decoding circuit 230 may read the processed sequence from the memory 210, such that the control apparatus 220 may sequentially output bit strings in the processed sequence. The compressed sequence may include fewer bit strings than a sequence before compression, and thus the decoding circuit 230 may reduce the number of reads from the memory 210. Thus, due to the reduction in the number of reads, the power consumption of the control apparatus 200 may be advantageously reduced by the control apparatus 200 of one or more embodiments. Accordingly, the control apparatus 200 of one or more embodiments may improve the technical field of neural network training by reducing the power consumption used by the control apparatus 200 to train a neural network through dropout, compared to a typical control apparatus.

Further, the decoding circuit 230 may determine a bit to be transmitted to the neural network circuit in the bit string of the compressed data sequence, such that the neural network circuit omits an operation with respect to non-consecutive invalid bits. When the operation with respect to the non-consecutive invalid bits is omitted, the decoding circuit 230 may advantageously improve the operation processing rate. Non-limiting example operations of the decoding circuit 230 omitting the operation with respect to the non-consecutive invalid bits will be described in detail later with reference to FIGS. 4A through 5.

Figure 3A:
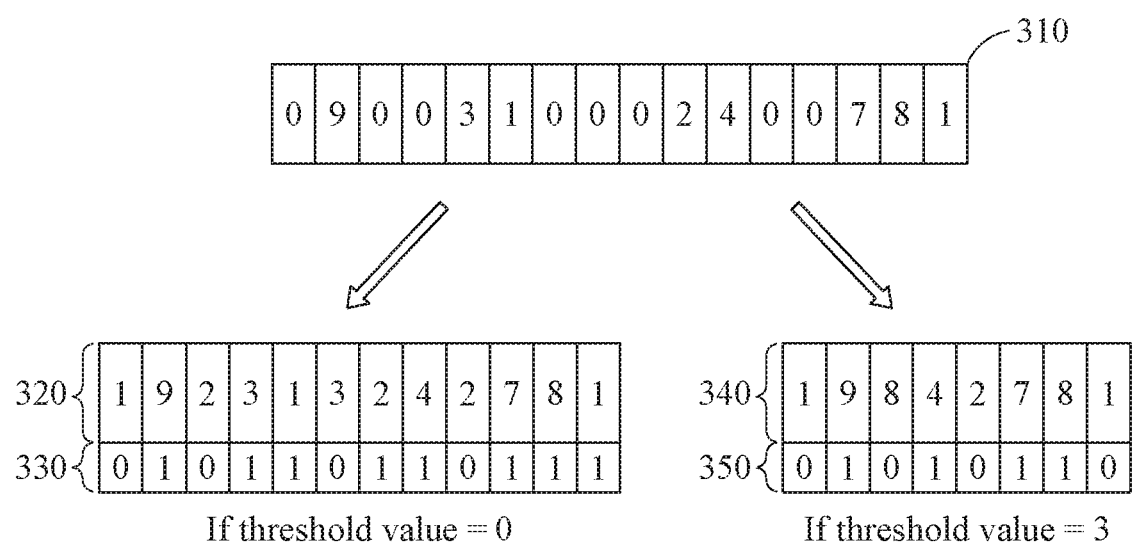
FIG. 3A illustrates an example of a sequence generated by an encoding circuit.

FIG. 3A illustrates an example of a sequence generated by an encoding circuit (e.g., the encoding circuit 220 of FIG. 2).

Referring to FIG. 3A, examples of a data sequence 310, compressed data sequences 320 and 340, and validity determination sequences 330 and 350 are illustrated.

The data sequence 310 may include information indicating a connection strength of predetermined edges. The data sequence 310 may include a bit string. A great bit value of a bit included in the bit string may indicate a high connection strength of predetermined edges, and a small bit value may indicate a low connection strength of predetermined edges.

The data sequence 310 may include valid bits and invalid bits. Whether a bit in the data sequence 310 is valid or invalid may be determined by comparing a size of the bit to a predetermined threshold value. When the bit in the data sequence 310 has a value less than or equal to the threshold value, the bit may be determined to be invalid. Being invalid may indicate that edges corresponding to the bit are disconnected. When a bit having a value less than or equal to the predetermined threshold value is determined to be invalid, computations using the bit may be determined as unnecessary to improve learning performance using pruning or dropout, and therefore such computations may be omitted from the pruning or dropout.

The encoding circuit 220 may generate the compressed data sequences 320 and 340 in which consecutive invalid bits in the bit string of the data sequence 310 are compressed into a single bit.

In an example of generating the compressed data sequence 320 and the validity determination sequences 330, when the predetermined threshold value is "0", a bit having a value less than or equal to "0" in the bit string of the data sequence 310 may be determined as invalid, and a bit having a value greater than "0" in the bit string of the data sequence 310 may be determined as valid. Further, the data sequence 310 may include consecutive bits having values less than or equal to the threshold value "0". When there are consecutive bits having values less than or equal to the threshold value "0", the encoding circuit 220 may generate the compressed data sequence 320 by expressing the consecutive bits with a single bit value. In an example, the single bit value may indicate the number of consecutive bits having values less than or equal to the threshold value "0" in the data sequence 310. For example, when the data sequence 310 includes three consecutive bits having values less than or equal to the threshold value "0", such as "000", "000" of the data sequence 310 may be expressed as "3" in the compressed data sequence 320. The encoding circuit 220 may compress consecutive invalid bits into a single bit as described above, thereby improving the operation speed of the neural network circuit 240. Further, when a bit of the data sequence 310 is greater than the predetermined threshold value "0", the bit may be included in the compressed data sequence 320. Accordingly, the encoding circuit 220 may compress the data sequence 310 of "0900310002400781" to generate the compressed data sequence 320 of "192313242781".

In an example of generating the compressed data sequence 340 and the validity determination sequences 350, when the predetermined threshold value is "3", a bit having a value less than or equal to "3" in the bit string of the data sequence 310 may be determined as invalid, and a bit having a value greater than "3" may be determined as valid. Further, the data sequence 310 may include consecutive bits having values less than or equal to the threshold value "3". When there are consecutive bits having values less than or equal to the threshold value "3", the encoding circuit 220 may generate the compressed data sequence 340 by expressing the consecutive bits with a single bit value. In this example, the single bit value may indicate the number of consecutive bits having values less than or equal to the threshold value "3" in the data sequence 310. For example, when the data sequence 310 includes eight consecutive bits having values less than or equal to the threshold value "3", such as "00310002", "00310002" of the data sequence 310 may be expressed as "8" in the compressed data sequence 340. The encoding circuit 220 may compress consecutive invalid bits into a single bit as described above, thereby improving the operation speed of the neural network circuit 240. Further, when a bit of the data sequence 310 is greater than the predetermined threshold value "3", the bit may be included in the compressed data sequence 340. Accordingly, the encoding circuit 220 may compress the data sequence 310 of "0900310002400781" to generate the compressed data sequence 340 of "19842781".

The encoding circuit 220 may generate the validity determination sequences 330 and 350 respectively indicating valid bits and invalid bits in the bit strings of the compressed data sequences 320 and 340.

The validity determination sequences 330 and 350 may be binary sequences expressed by "0" and "1". For example, a value "0" included in the bit strings of the validity determination sequences 330 and 350 may indicate that a bit corresponding to an address of a corresponding bit in the compressed data sequences 320 and 340 is an invalid bit. Further, a value "1" included in the bit strings of the validity determination sequences 330 and 350 may indicate that a bit corresponding to an address of a corresponding bit in the compressed data sequences 320 and 340 is a valid bit.

The decoding circuit 230 may read the compressed data sequences 320 and 340 and the validity determination sequences 330 and 350 from the memory 210. The decoding circuit 230 may determine bits to be transmitted to the neural network circuit 240 in the bit strings of the compressed data sequences 320 and 340 based on the validity determination sequences 330 and 350, such that the neural network circuit 240 may omit the operation with respect to the non-consecutive invalid bits.

Figure 3B:
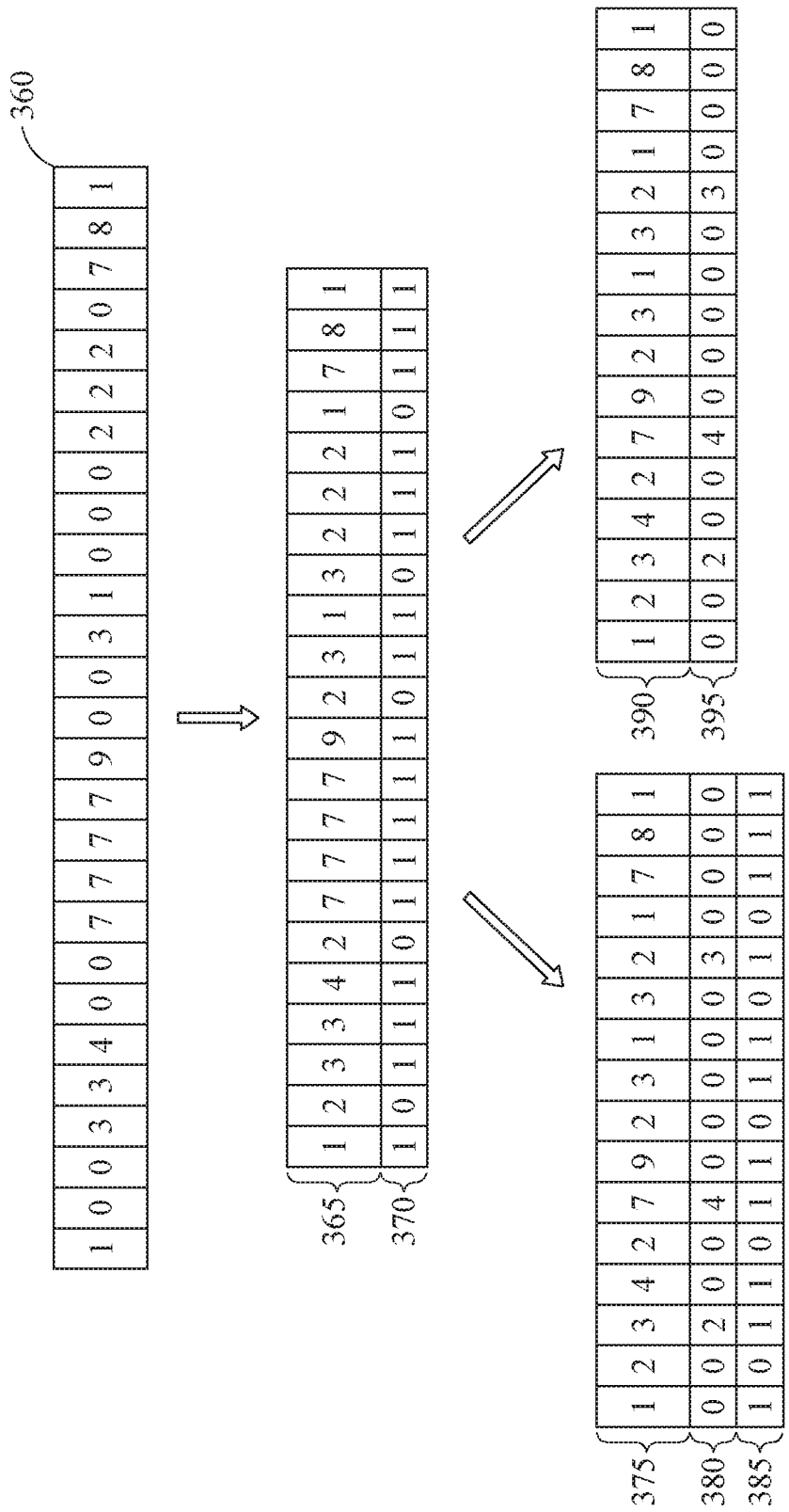
FIG. 3B illustrates an example of a sequence generated by an encoding circuit.

FIG. 3B illustrates an example of a sequence generated by an encoding circuit (e.g., encoding circuit 220 of FIG. 2).

Referring to FIG. 3B, examples of a data sequence 360, compressed data sequences 365, 375, and 390, and validity determination sequences 370, 380, 385, and 395 are illustrated.

The data sequence 360, the compressed data sequence 365, and the validity determination sequences 370 and 385 may respectively be generated by the same operations used to generate to the data sequence 310, the compressed data sequence 320 and 340, and the validity determination sequences 330 and 350 of FIG. 3A. For example, the encoding circuit 220 may generate the compressed data sequence 365 by expressing consecutive bits of the data sequence 360, having values less than or equal to a threshold value "0", with a single bit indicating the number of the consecutive bits.

The encoding circuit 220 may generate the compressed data sequences 375 and 390 by compressing consecutive invalid bits in a bit string of the data sequence 360 into a single bit and further compressing consecutive valid bits having the same bit value into a single bit.

For example, the data sequence 360 may include consecutive bits having the same value greater than a threshold value "0". When there are consecutive bits having the same value greater than the threshold value "0" in the data sequence 360, the encoding circuit 220 may generate the compressed data sequences 375 and 390 by expressing the consecutive bits with a single bit value. In an example, the single bit value may be expressed by the bit value of the consecutive bits in the data sequence 360. For example, when the data sequence 360 includes four consecutive bits having values greater than the threshold value "0", such as "7777", "7777" of the data sequence 360 may be expressed as "7" in the compressed data sequences 375 and 390. As another example, when the data sequence 360 includes three consecutive bits having values greater than the threshold value "0", such as "222", "222" of the data sequence 360 may be expressed as "2" in the compressed data sequences 375 and 390. The encoding circuit 220 may compress consecutive valid bits into a single bit as described above, thereby improving the operation speed of the neural network circuit 240. Accordingly, the encoding circuit 220 may compress the data sequence 360 of "1003340077779003100022207 81" to generate the compressed data sequences 375 and 390 of "1234279231321781".

The encoding circuit 220 may generate the validity determination sequences 370 and 385 respectively indicating valid bits and invalid bits in the bit strings of the compressed data sequences 365 and 375. Further, the encoding circuit 220 may generate the validity determination sequence 380 indicating the number of consecutive valid bits having the same bit value in the bit strings of the compressed data sequences 365 and 375.

For example, a value "0" included in the bit string of the validity determination sequence 385 may indicate that a bit corresponding to an address of a corresponding bit in the compressed edge sequence 375 is an invalid bit. In this example, a bit corresponding to the invalid bit in the validity determination sequence 380 has a value "0".

When a bit value in the validity determination sequence 385 is "1", the number of consecutive valid bits having the same bit value may be determined using the validity determination sequence 380. For example, a value "4" included in the bit string of the validity determination sequence 380 may indicate that a bit corresponding to an address of a corresponding bit in the compressed data sequence 375 appears consecutively four times in the compressed data sequence 365 and in the data sequence 360.

The encoding circuit 220 may generate the validity determination sequence 395 that indicates valid bits and invalid bits in the bit strings of the compressed data sequences 365 and 390 and that simultaneously indicates the number of consecutive valid bits having the same bit value.

For example, a value "0" included in the bit string of the validity determination sequence 395 may indicate that a bit corresponding to an address of a corresponding bit in the compressed edge sequence 390 is an invalid bit. In this example, a bit corresponding to the invalid bit in the validity determination sequence 380 has a value "0". Further, a non-zero value included in the bit string of the validity determination sequence 395 may indicate that a bit corresponding to an address of a corresponding bit in the compressed edge sequence 390 is a valid bit and may indicate that the bit corresponding to the address of the corresponding bit in the compressed edge sequence 390 appears consecutively a number of times corresponding to the bit value.

For example, a value "4" included in the bit string of the validity determination sequence 395 indicates that a bit corresponding to an address of a corresponding bit in the compressed data sequence 390 is valid and indicates that the valid bit appears consecutively four times in the compressed data sequence 365 and in the data sequence 360. Further, a value "0" included in the bit string of the validity determination sequence 395 may indicate that a bit corresponding to an address of a corresponding bit in the compressed data sequence 390 is invalid.

FIGS. 4A through 4G illustrate examples of performing an operation in a neural network based on an output of a control apparatus.

Referring to FIGS. 4A through 4G, a control apparatus 420 may output data for an operation of a neural network (for example, a fully connected network) to a neural network circuit 440. For example, the data output from the control apparatus 420 may be input data for a current layer of the neural network. An operation may be performed using the input data for the current layer output from the control apparatus 420 and a weight sequence 430 of the current layer. Although FIGS. 4A through 4G illustrate an example in which the control apparatus 420 outputs the input data for the current layer, an operation may be performed using the weight sequence 430 of the current layer output from the control apparatus 420 and the input data for the current layer, in some examples.

The neural network circuit 440 may perform a multiplication operation between matrices using a processing element. The neural network circuit 440 may output, as an output of the current layer, a result of performing an operation using the data output from the control apparatus 420 and the weight sequence 430.

A decoding circuit 423 may include a buffer that sequentially stores a compressed data sequence and a validity determination sequence. The buffer may be a ring buffer.

The decoding circuit 423 may store a first pointer (for example, "c" of FIGS. 4A through 4G) indicating a location at which a current bit of a compressed data sequence to be transmitted to the neural network circuit is stored in the buffer, a second pointer (for example, "n" of FIGS. 4A through 4G) indicating a location at which a next bit of the compressed data sequence to be transmitted to the neural network circuit at a next cycle of the current bit is stored in the buffer, and a third pointer (for example, "w" of FIGS. 4A through 4G) indicating a location at which the compressed data sequence and the validity determination sequence are to be stored in the buffer. Here, the first pointer may be referred to as the current pointer, the second pointer may be referred to as the next pointer, and the third pointer may be referred to as the write pointer.

The decoding circuit 423 may determine bits to be transmitted to the neural network circuit 440 in a bit string of the compressed data sequence based on the validity determination sequence, such that the neural network circuit omits an operation with respect to non-consecutive invalid bits.

The decoding circuit 423 may read the compressed data sequence and the validity determination sequence from the memory and sequentially store the compressed data sequence and the validity determination sequence in the buffer in the FIFO manner. In detail, the decoding circuit 423 may read a bit indicated by a read pointer (for example, "r" of FIGS. 4A through 4G) in the compressed data sequence and the validity determination sequence from the memory and write the bit to the location corresponding to the third (or write) pointer in the buffer. The decoding circuit 423 may move the read pointer and the third pointer by one space.

The decoding circuit 423 may move the first (or current) pointer and the second (or next) pointer by one space when a bit value corresponding to the second pointer in the validity determination sequence is "1", and may move the first pointer and the second pointer by two spaces when the bit value corresponding to the second pointer in the validity determination sequence is "0".

The decoding circuit 423 may determine a bit value corresponding to the first pointer in the compressed data sequence and the validity determination sequence to be a bit waiting to be output.

Figure 4A:
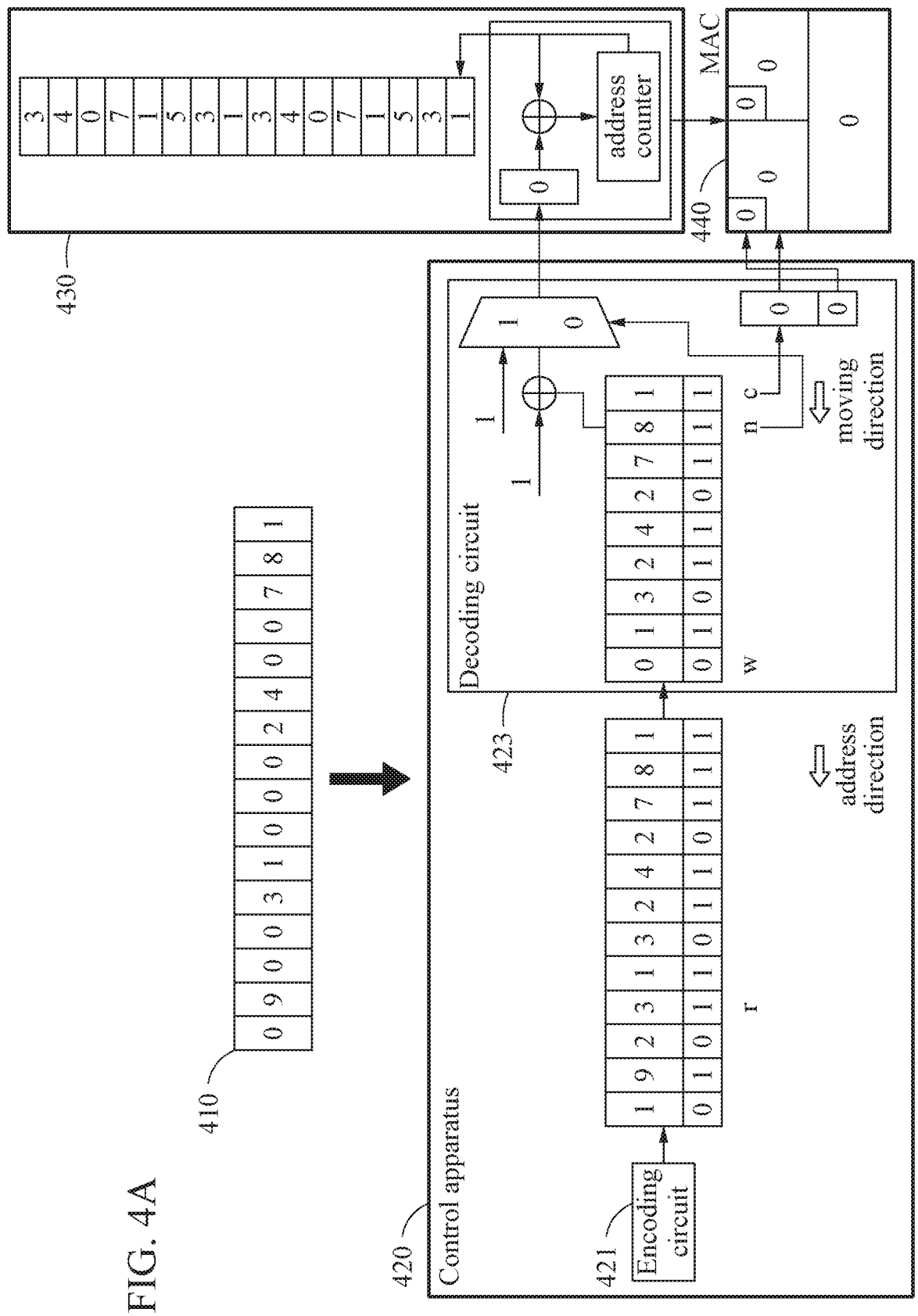
FIGS. 4A through 4G illustrate examples of performing an operation in a neural network based on an output of a control apparatus.

Referring to FIG. 4A, an example of a compressed data sequence "192313242781" and a validity determination sequence "010110110111" to be output from the control apparatus 420 to the neural network circuit 440 is illustrated.

The compressed data sequence "192313242781" and the validity determination sequence "010110110111" may be generated based on a data sequence 410 by an encoding circuit 421 and may be written to the memory.

The decoding circuit 423 may input a value obtained by adding "a" to the bit value corresponding to the second pointer in the validity determination sequence as data of a multiplexer, and may input the bit value corresponding to the second pointer in the validity determination sequence as a control signal of the multiplexer.

Figure 4B:
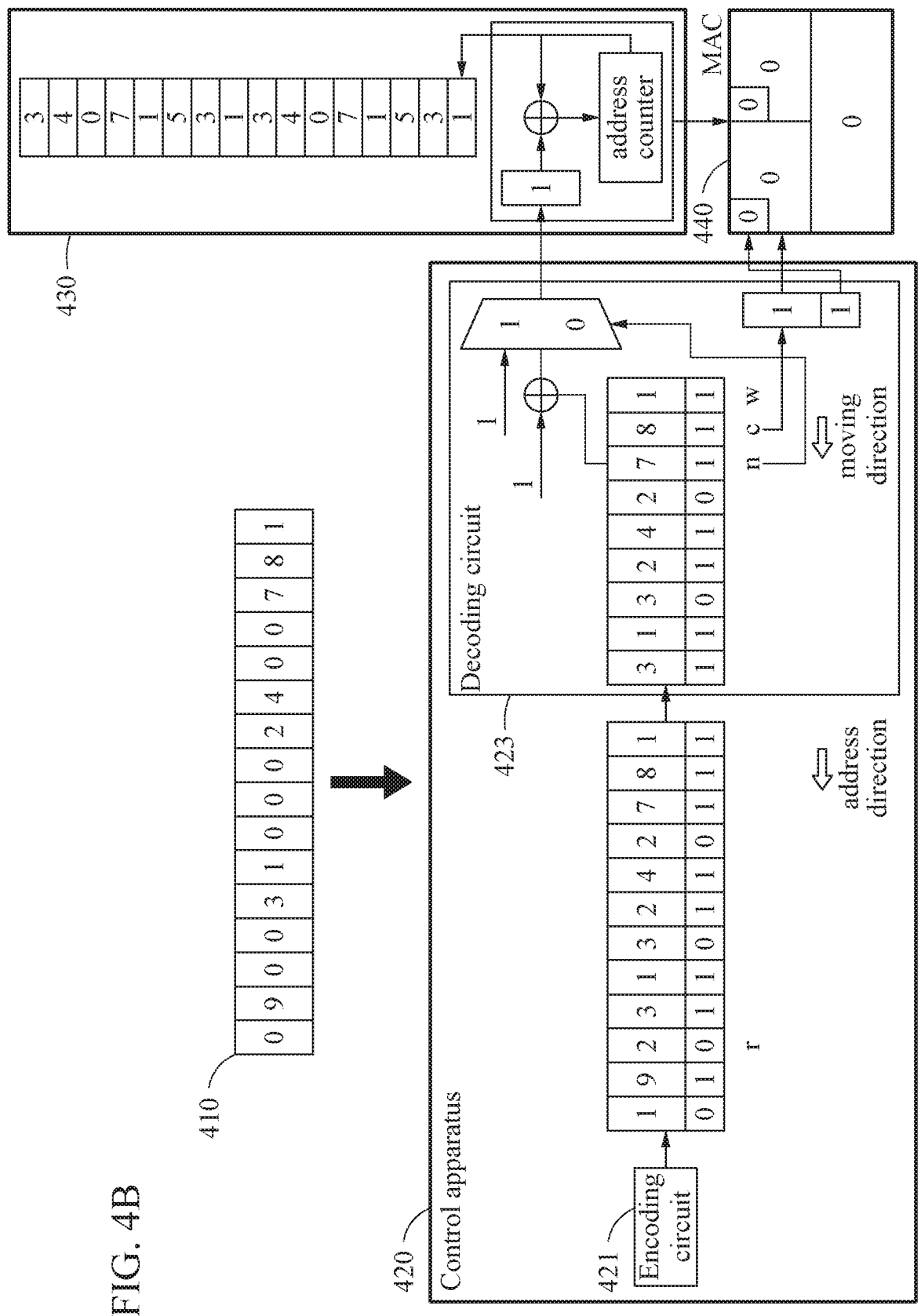

Referring to FIG. 4B, the decoding circuit 423 may move the first pointer and the second pointer by one space when the bit value corresponding to the second pointer in the validity determination sequence is "1" in the cycle of FIG. 4A.

In FIG. 4B, a current address counter of the weight sequence 430 may indicate an address corresponding to a first bit of the weight sequence 430, and the decoding circuit 423 may transmit "1" being an output of the multiplexer to the address counter when the bit value corresponding to the second pointer in the validity determination sequence is "1" in the cycle of FIG. 4A. The value transmitted to the address counter may indicate a difference between a bit address of the weight sequence 430 of the current operation and a bit address of the weight sequence 430 of the next operation. For example, when the value "1" is transmitted to the address counter, a bit after one space participates in the next operation.

In FIG. 4B, the decoding circuit 423 may identify that a bit value of a bit waiting to be output in the compressed data sequence is "1" (e.g., when the bit value corresponding to the first pointer in the compressed data sequence is "1" in the cycle of FIG. 4A).

In FIG. 4B, the decoding circuit 423 may transmit the corresponding compressed data sequence to the neural network circuit 440 when a bit value of a bit waiting to be output in the validity determination sequence is "1" in the cycle of FIG. 4A, and may not transmit the corresponding compressed data sequence to the neural network circuit 440 when the bit value of the bit waiting to be output in the validity determination sequence is "0" in the cycle of FIG. 4A.

Figure 4C:
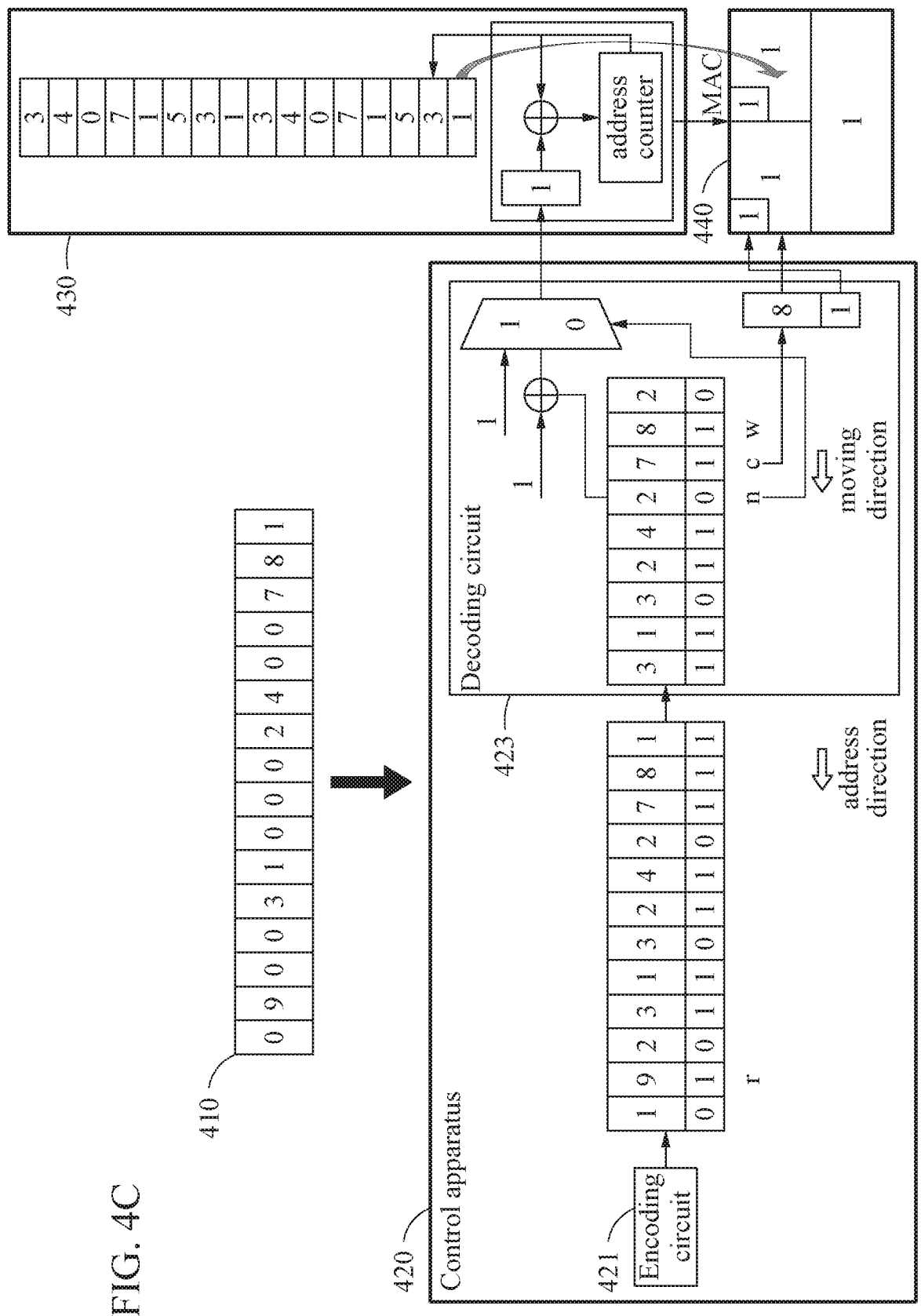

Referring to FIG. 4C, the decoding circuit 423 may move the first pointer and the second pointer by one space when the bit value corresponding to the second pointer in the validity determination sequence is "1" in the cycle of FIG. 4B.

In FIG. 4C, a current address counter of the weight sequence 430 may indicate an address corresponding to a second bit of the weight sequence 430, and the decoding circuit 423 may transmit "1" to the address counter when the bit value corresponding to the second pointer in the validity determination sequence is "1" in the cycle of FIG. 4B.

In FIG. 4C, the decoding circuit 423 may identify that a bit value of a bit waiting to be output in the compressed data sequence is "8" (e.g., when the bit value corresponding to the first pointer in the compressed data sequence is "8" in the cycle of FIG. 4B), and the bit value "1" of the bit waiting to be output in the compressed data sequence in FIG. 4B and the first bit "1" of the weight sequence 430 indicated by the address counter of FIG. 4B may participate in the operation of the neural network circuit 440 in the cycle of FIG. 4C.

Thus, in FIG. 4C, the bit value "1" of the compressed data sequence output from the decoding circuit 423 and the bit value "1" output from the weight sequence 430 may be input into the neural network circuit 440. The neural network circuit 440 may store a value "1" by multiplying the bit value "1" of the compressed data sequence and the bit value "1" of the weight sequence 430.

Figure 4D:
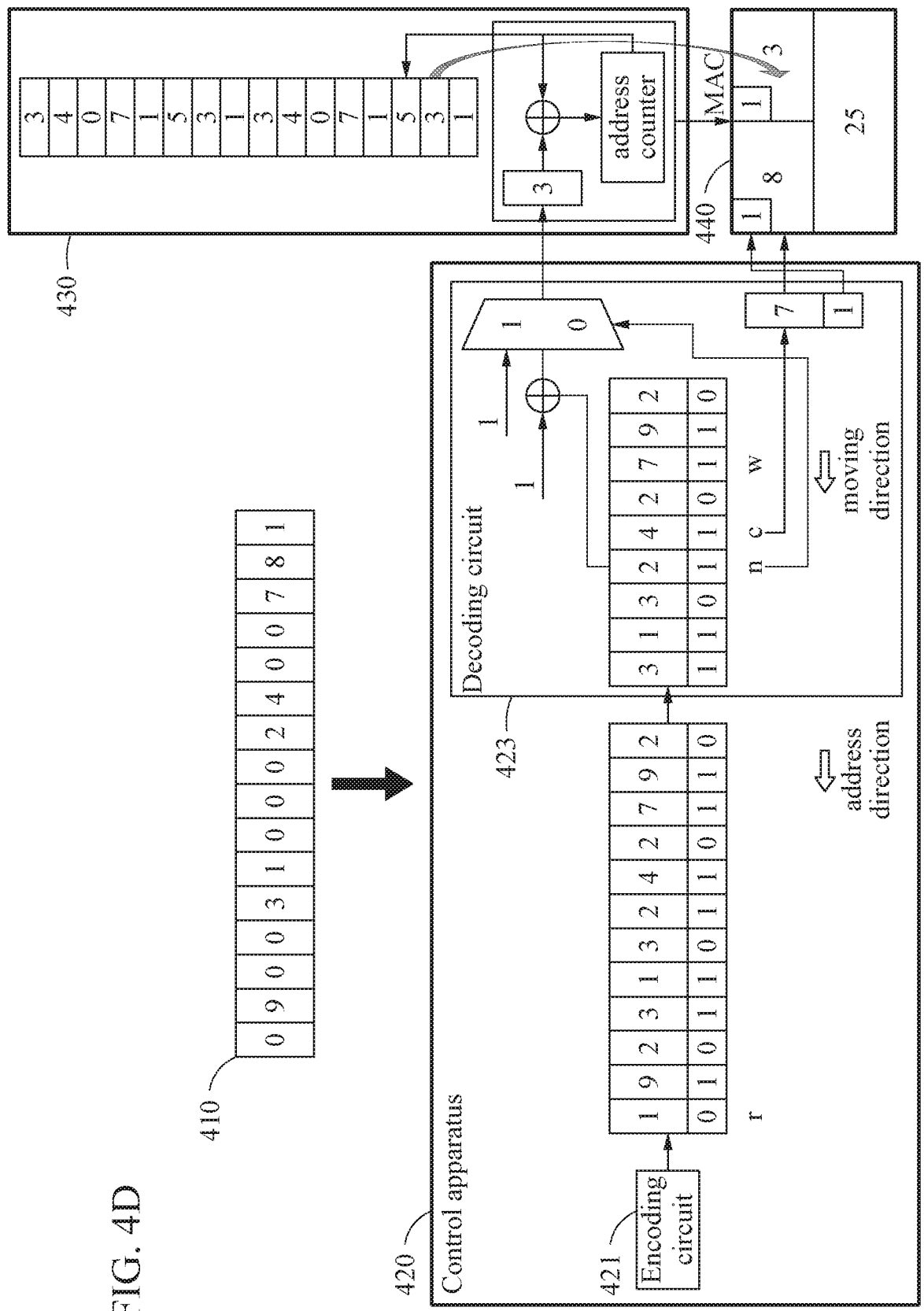

Referring to FIG. 4D, the decoding circuit 423 may move the first pointer and the second pointer by two spaces when the bit value corresponding to the second pointer in the validity determination sequence is "0" in the cycle of FIG. 4C.

In FIG. 4D, a current address counter of the weight sequence 430 may indicate an address corresponding to a third bit of the weight sequence 430, and the decoding circuit 423 may transmit "3" (obtained by adding "1" to the bit value corresponding to the second pointer in the compressed data sequence of FIG. 4D) to the address counter when the bit value corresponding to the second pointer in the validity determination sequence is "0" in the cycle of FIG. 4C.

In FIG. 4D, the decoding circuit 423 may identify that a bit value of a bit waiting to be output in the compressed data sequence is "7" (e.g., when the bit value corresponding to the first pointer in the compressed data sequence is "7" in the cycle of FIG. 4C), and the bit value "8" of the bit waiting to be output in the compressed data sequence in FIG. 4C and the second bit "3" of the weight sequence 430 indicated by the address counter of FIG. 4C may participate in the operation of the neural network circuit 440 in the cycle of FIG. 4D.

Thus, in FIG. 4D, the bit value "8" of the compressed data sequence output from the decoding circuit 423 and the bit value "3" output from the weight sequence 430 may be input into the neural network circuit 440. The neural network circuit 440 may store a value "25" by adding "24" (obtained by multiplying the bit value "8" of the compressed data sequence by the bit value "3" of the weight sequence 430) to "1" that is the already stored intermediate result value from the cycle of FIG. 4C.

Figure 4E:
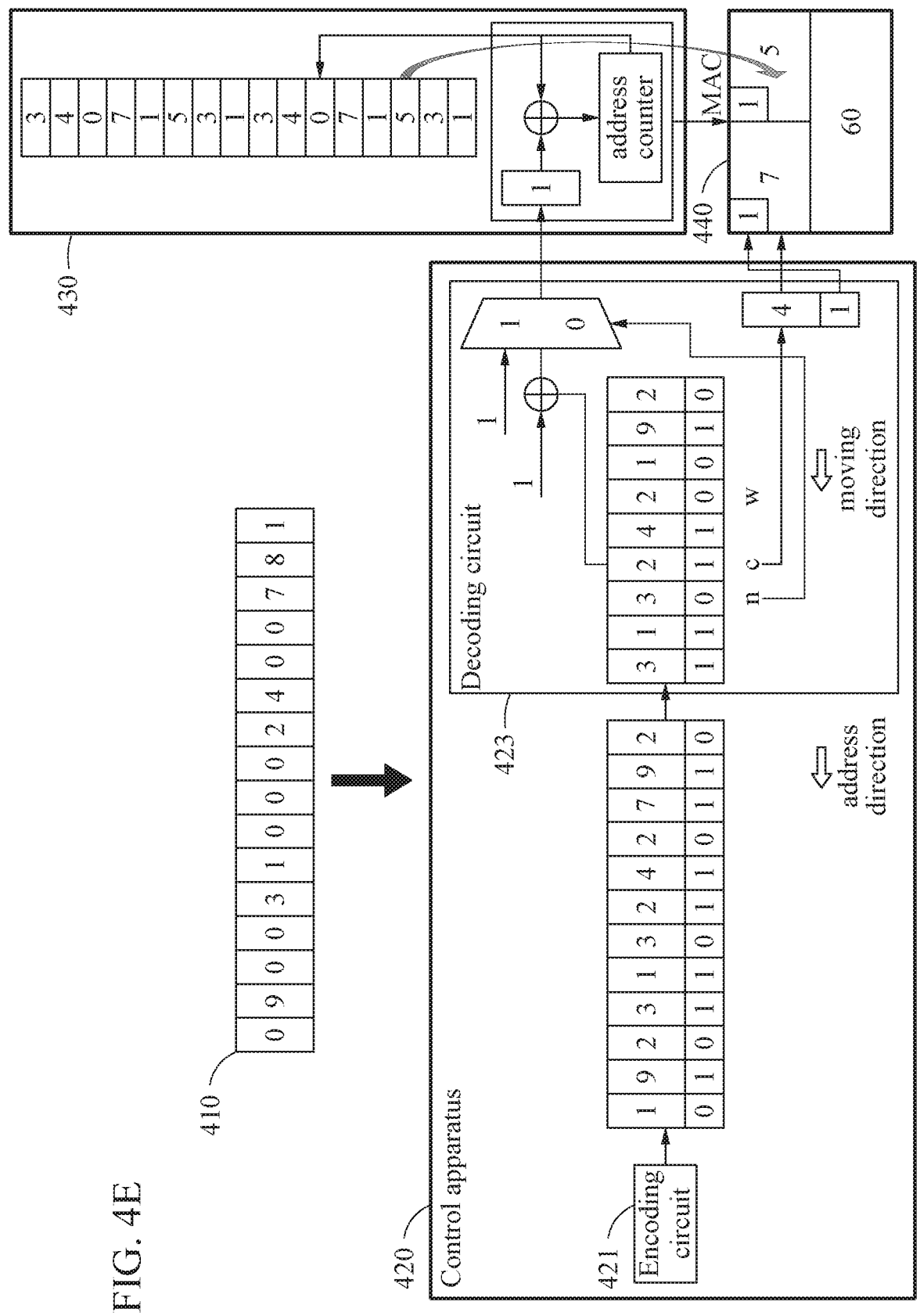

Referring to FIG. 4E, the decoding circuit 423 may move the first pointer and the second pointer by one space when the bit value corresponding to the second pointer in the validity determination sequence is "1" in the cycle of FIG. 4D.

In FIG. 4E, a current address counter of the weight sequence 430 may indicate an address corresponding to a sixth bit of the weight sequence 430, and the decoding circuit 423 may transmit "1" to the address counter when the bit value corresponding to the second pointer in the validity determination sequence is "1" in the cycle of FIG. 4D.

In FIG. 4E, the decoding circuit 423 may identify that a bit value of a bit waiting to be output in the compressed data sequence is "4" (e.g., when the bit value corresponding to the first pointer in the compressed data sequence is "4" in the cycle of FIG. 4D), and the bit value "7" of the bit waiting to be output in the compressed data sequence in FIG. 4D and the third bit "5" of the weight sequence 430 indicated by the address counter of FIG. 4D may participate in the operation of the neural network circuit 440 in the cycle of FIG. 4E.

Thus, in FIG. 4E, the bit value "7" of the compressed data sequence output from the decoding circuit 423 and the bit value "5" output from the weight sequence 430 may be input into the neural network circuit 440. The neural network circuit 440 may store a value "60" by adding "35" (obtained by multiplying the bit value "7" of the compressed data sequence by the bit value "5" of the weight sequence 430) to "25" that is the already stored intermediate result value from the cycle of FIG. 4D.

Figure 4F:
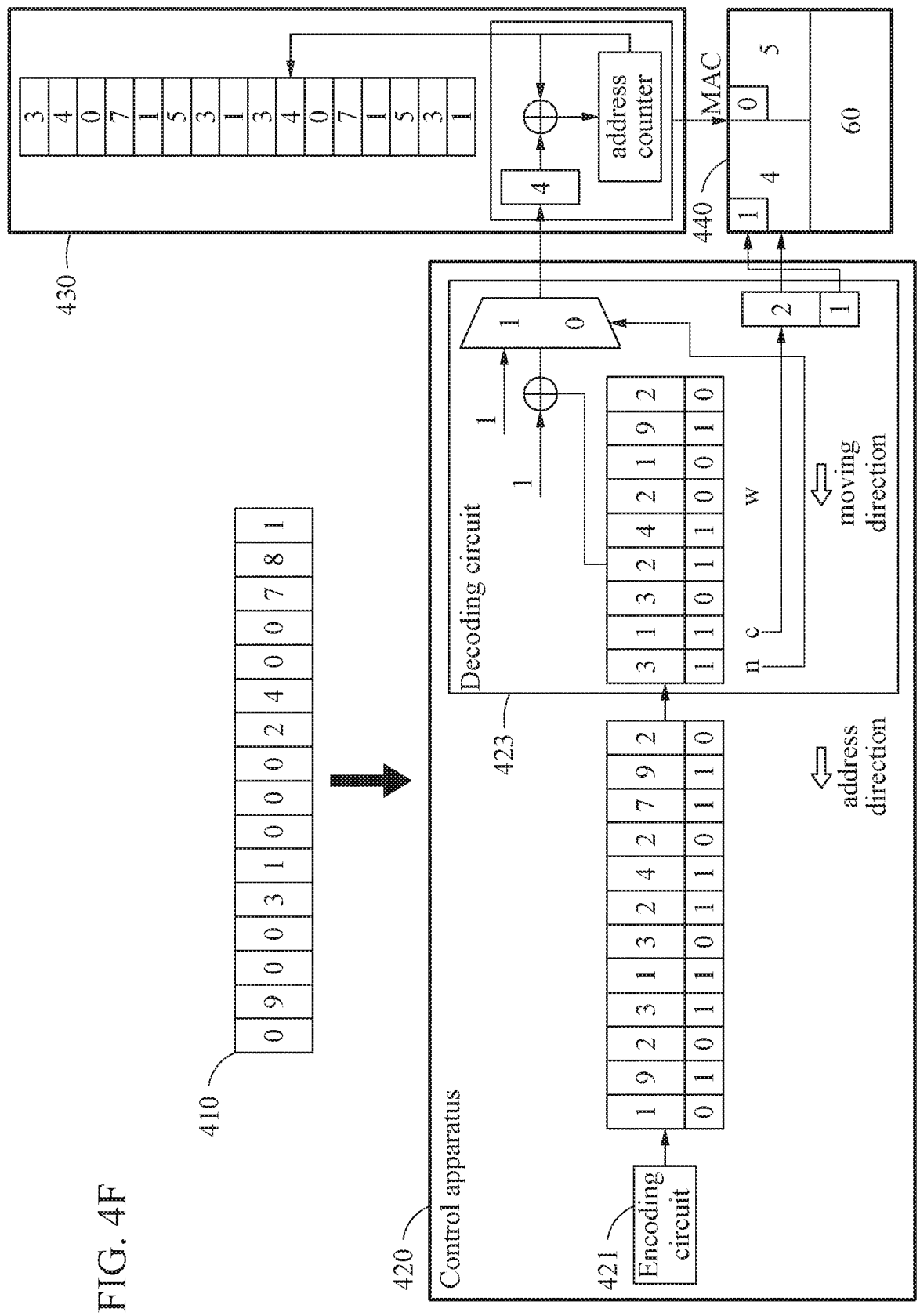

Referring to FIG. 4F, the decoding circuit 423 may move the first pointer and the second pointer by two spaces when the bit value corresponding to the second pointer in the validity determination sequence is "0" in the cycle of FIG. 4E.

In FIG. 4F, a current address counter of the weight sequence 430 may indicate an address corresponding to a seventh bit of the weight sequence 430, and the decoding circuit 423 may transmit "4" (obtained by adding "1" to the bit value corresponding to the second pointer in the compressed data sequence of FIG. 4F) to the address counter when the bit value corresponding to the second pointer in the validity determination sequence is "0" in the cycle of FIG. 4E.

In FIG. 4F, the decoding circuit 423 may identify that a bit value of a bit waiting to be output in the compressed data sequence is "2" (e.g., when the bit value corresponding to the first pointer in the compressed data sequence is "2" in the cycle of FIG. 4E), and the bit value "4" of the bit waiting to be output in the compressed data sequence in FIG. 4E and the sixth bit "0" of the weight sequence 430 indicated by the address counter of FIG. 4E may participate in the operation of the neural network circuit 440 in the cycle of FIG. 4F.

However, in FIG. 4F, when the bit of the weight sequence 430 participating in the operation is "0", the bit may be determined to be invalid and thus, may not transmitted to the neural network circuit 440. Accordingly, the neural network circuit 440 may not perform a multiplication operation with the compressed data sequence. Thus, the bit value indicated by the data sequence of the weight sequence 430 stored in the neural network circuit 440 may be maintained as a value "5", and the bit value indicated by the validity determination sequence of the weight sequence 430 may be set to "0". In addition, the neural network circuit 440 may still retain "60" that is the already stored intermediate result value from the cycle of FIG. 4E.

Figure 4G:
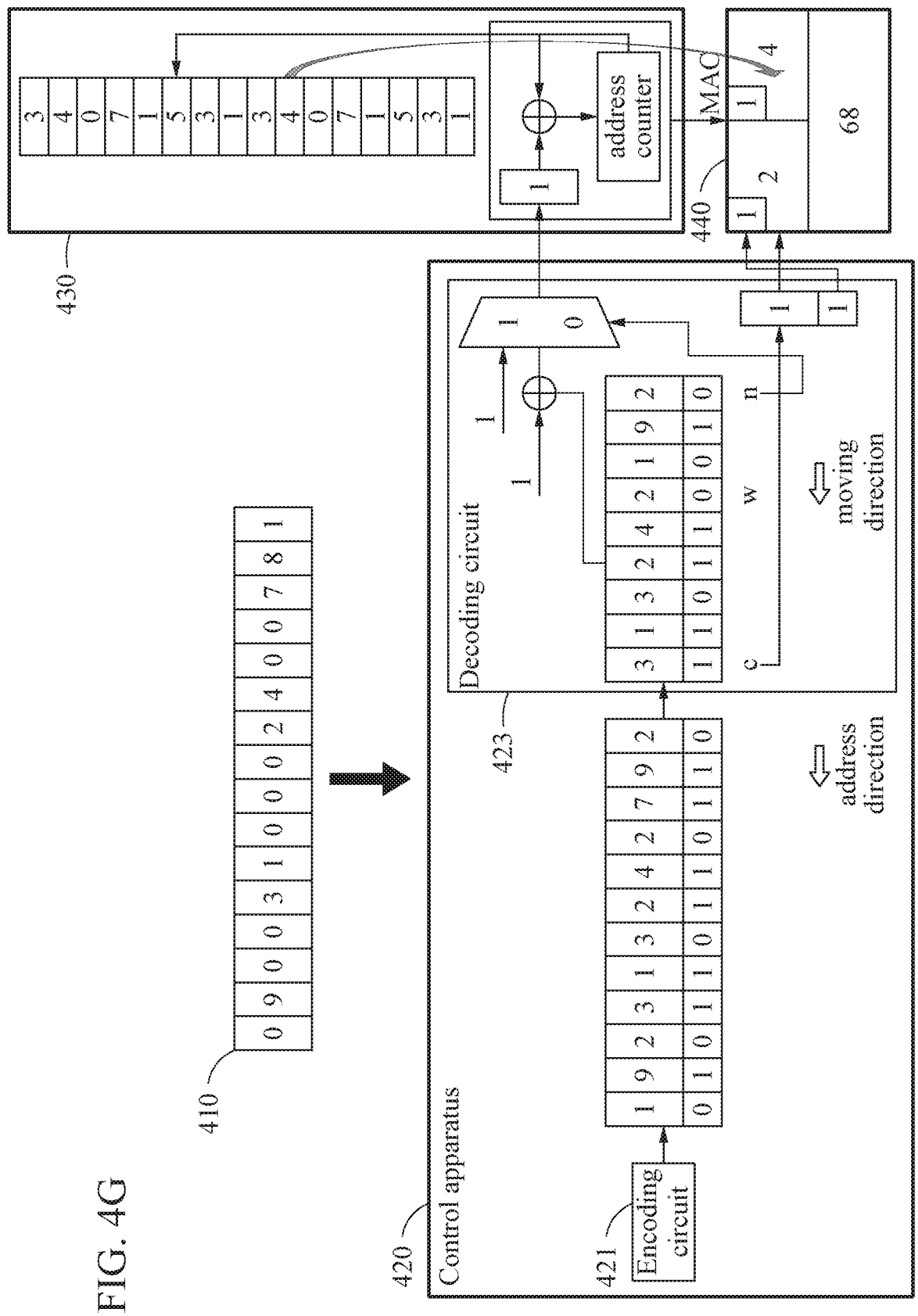

Referring to FIG. 4G, the decoding circuit 423 may move the first pointer and the second pointer by one space when the bit value corresponding to the second pointer in the validity determination sequence is "1" in the cycle of FIG. 4F.

In FIG. 4G, a current address counter of the weight sequence 430 may indicate an address corresponding to an eleventh bit of the weight sequence 430, and the decoding circuit 423 may transmit "1" to the address counter when the bit value corresponding to the second pointer in the validity determination sequence is "1" in the cycle of FIG. 4F.

In FIG. 4G, the decoding circuit 423 may identify that a bit value of a bit waiting to be output in the compressed data sequence is "1" (e.g., when the bit value corresponding to the first pointer in the compressed data sequence is "1" in the cycle of FIG. 4F), and the bit value "2" of the bit waiting to be output in the compressed data sequence in FIG. 4F and the seventh bit "4" of the weight sequence 430 indicated by the address counter of FIG. 4F may participate in the operation of the neural network circuit 440 in the cycle of FIG. 4G.

Thus, in FIG. 4G, the bit value "2" of the compressed data sequence output from the decoding circuit 423 and the bit value "4" output from the weight sequence 430 may be input into the neural network circuit 440. The neural network circuit 440 may store a value "68" by adding "8" (obtained by multiplying the bit value "2" of the compressed data sequence by the bit value "4" of the weight sequence 430) to "60" that is the already stored intermediate result value from the cycle of FIG. 4F.

According to the example described with reference to FIGS. 4A through 4G, invalid bits may not be output to the neural network circuit 440, and thus the control apparatus of one or more embodiments may be configured to omit operations with respect to not only consecutive invalid bits but also non-consecutive invalid bits.

Figure 5:
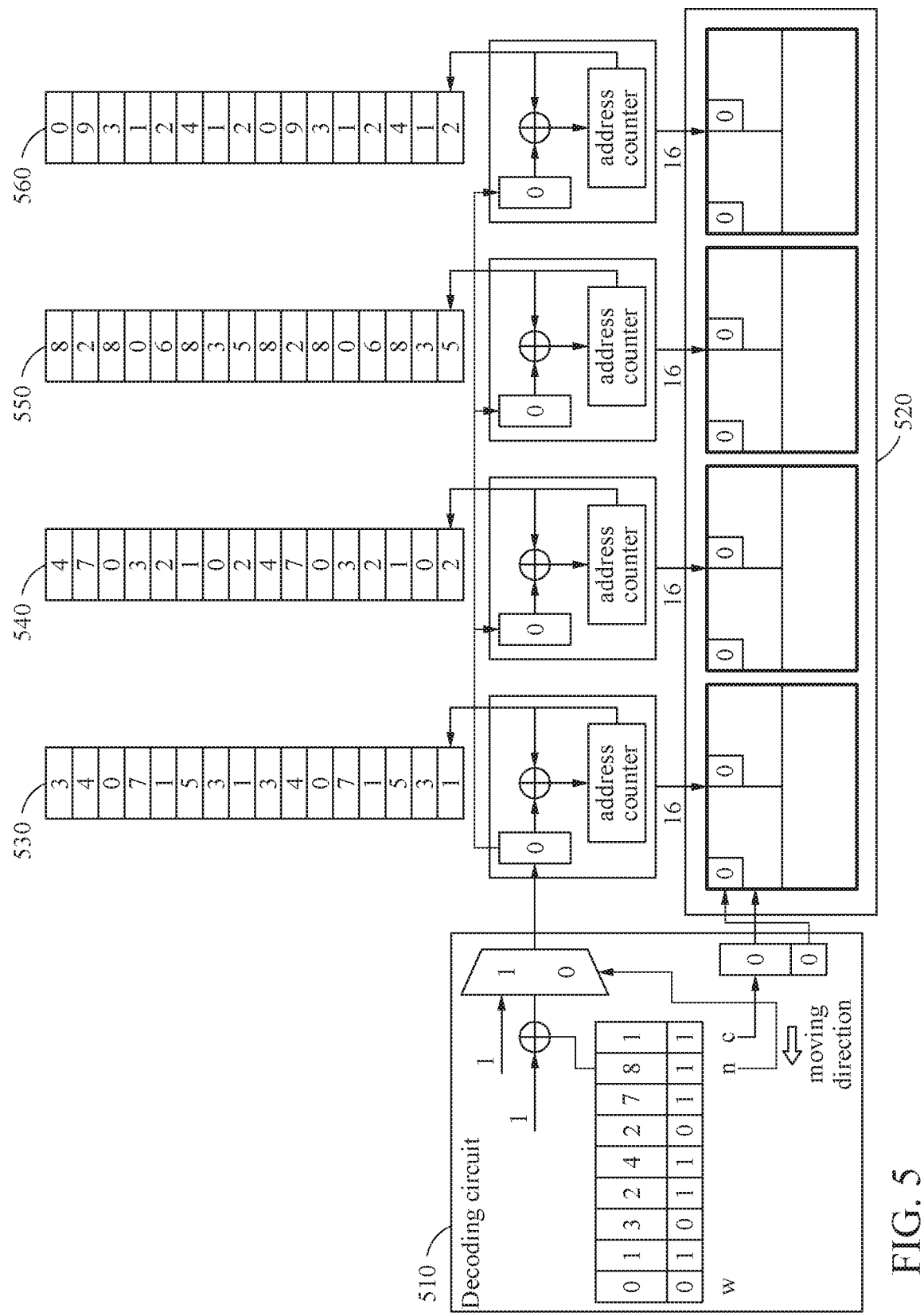
FIG. 5 illustrates an example of performing an operation in a neural network based on an output of a control apparatus.

FIG. 5 illustrates an example of performing an operation in a neural network based on an output of a control apparatus.

Referring to FIG. 5, a decoding circuit 510 of a control apparatus may output data for training of a neural network (for example, a fully connected network) to a neural network circuit 520. The data output from the decoding circuit 510 of the control apparatus may be input data for a current layer of the neural network. An operation may be performed by the neural network circuit 520 using the input data for the current layer output from the decoding circuit 510 of the control apparatus and weight data 530, 540, 550, and 560 of the current layer. Such an operation may include a multiplication operation between a weight matrix (for example, in the size of 4×16) and an input matrix (for example, in the size of 16×1). The neural network circuit 520, also referred to as the training circuit 520, may perform a multiplication operation between matrices using a plurality of processing elements. Data may move sequentially from left to right between the processing elements.

The process of performing an operation in a neural network based on an output of a control apparatus according to the example of FIG. 5 may be performed by iteratively performing the process of performing an operation in a neural network circuit based on an output of a control apparatus according to the example of FIGS. 4A through 4G a number of times corresponding to the number of items of weight data.

FIG. 6 illustrates an example of zero gating.

Referring to FIG. 6, a validity determination sequence may be used as a clock gating signal to perform an operation of a neural network circuit. A decoding circuit of a control apparatus may determine whether a current bit corresponding to a first pointer is valid, and may not transmit the current bit to a neural network circuit when the current bit is invalid (for example, if a bit value of the bit in a validity determination sequence is "0"). The decoding circuit may initiate an operation when data input into the neural network circuit 440 is valid, thereby reducing the power consumption of the neural network circuit.

As described above with reference to FIGS. 4A through 4G, the decoding circuit may move the first pointer and a second pointer by two spaces when a bit value corresponding to the second pointer in the validity determination sequence is "0", and thus the current value corresponding to the first pointer generally has a valid value.

However, since the first pointer and the second pointer do not overtake a third pointer, the current bit corresponding to the first pointer may have an invalid value in a predetermined circumstance.

For example, in an example 610, a bit value corresponding to a second pointer (e.g., "N") in a compressed data sequence may be invalid, and thus a first pointer (e.g., "C") and the second pointer may be moved by two spaces. However, in an example 620, the first and second pointers may be moved by one space when the first pointer and the second pointer do not overtake a third pointer (e.g., "W").

Accordingly, in the example 620, the current bit corresponding to the first pointer may have an invalid value. In an example 630, the current bit corresponding to the first pointer may be determined to be an invalid value by the clock gating signal "1", and thus the decoding circuit maintains the bit value indicated by the previous data sequence to be "9", without transmitting the current bit to the neural network circuit.

Each of the examples 610, 620, and 630 may include a data sequence corresponding to the first row and a validity determination sequence corresponding to the second row.

Figure 7:
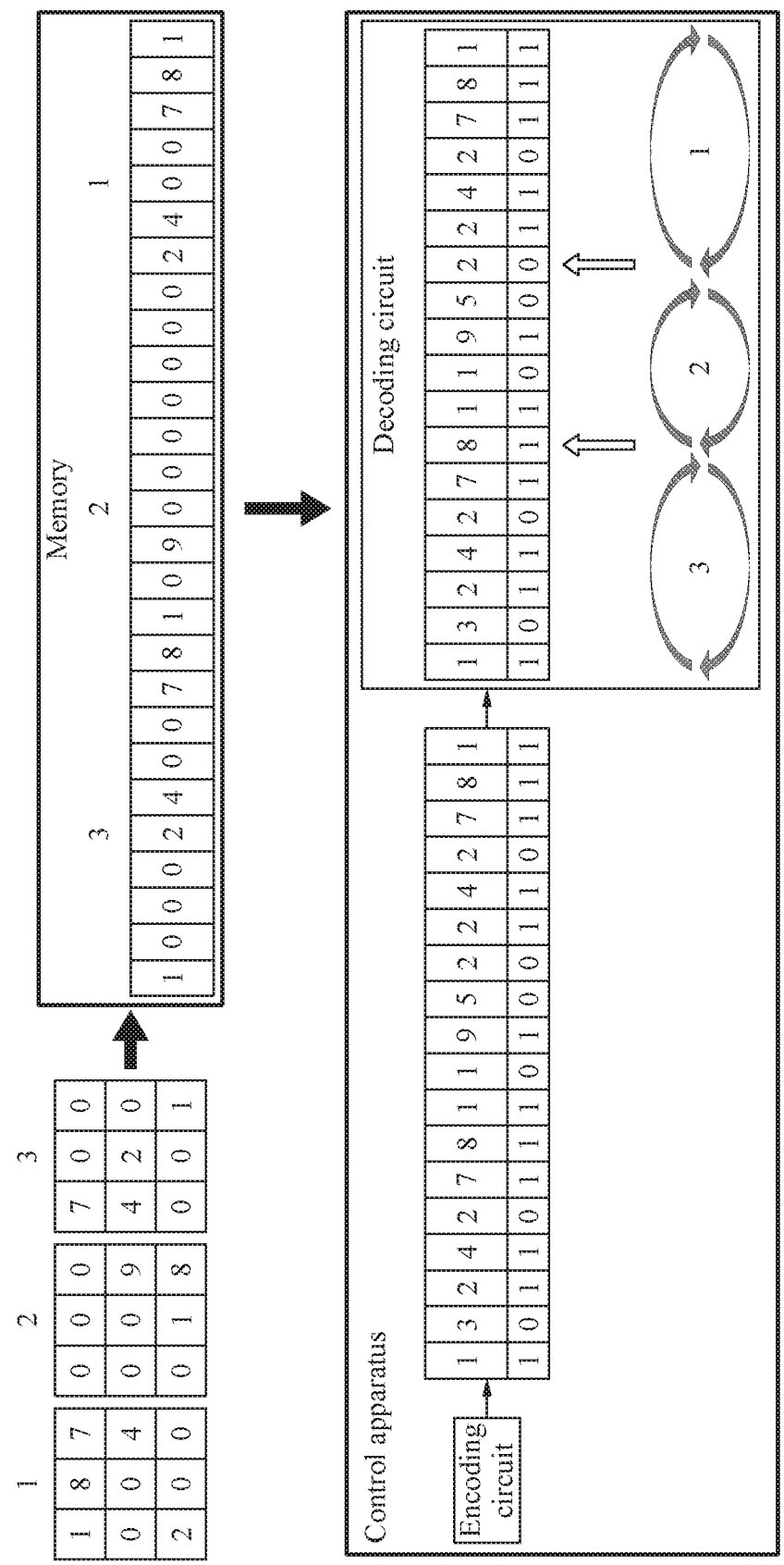
FIG. 7 illustrates an example of increasing a reuse rate by storing a range of a value iteratively used.

FIG. 7 illustrates an example of increasing a reuse rate by storing a range of a value iteratively used.

Referring to FIG. 7, a decoding circuit may store a fourth pointer for identifying a plurality of reused data when a data sequence includes the plurality of reused data. Here, the fourth pointer may also be referred to as the iteration pointer.

The decoding circuit may place multiple fourth pointers expressing iteration intervals when inserting a data sequence to be reused into a buffer, thereby facilitating iteration. The decoding circuit may split invalid data into two segments and store the segments separately in the buffer when the invalid data exceeds the iteration range.

The decoding circuit may store the fourth pointer indicating the range of iteration, and iteratively decode data of a next iteration interval after reusing data in the range until the data are reused to the maximum.

Figure 8:
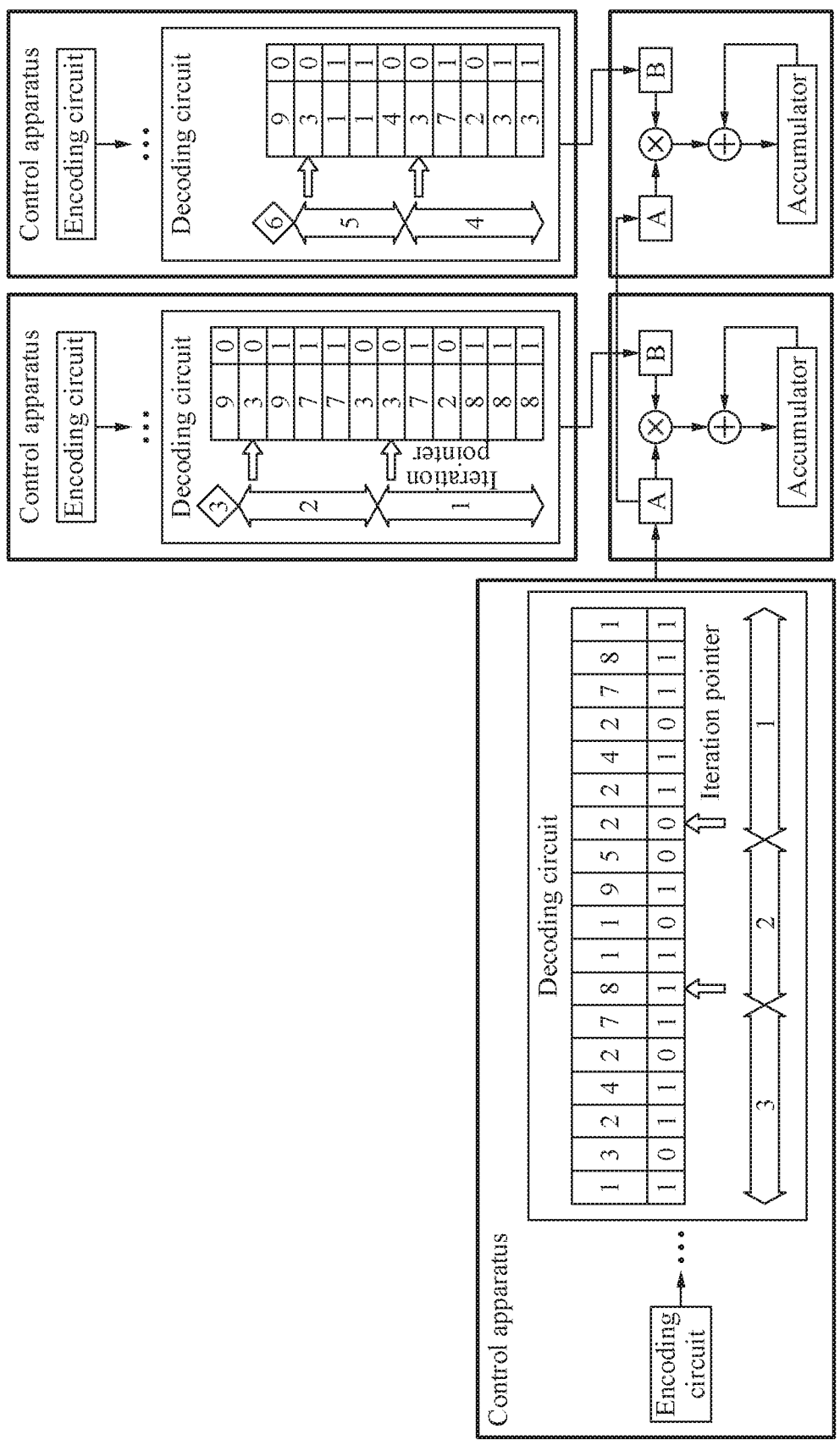
FIG. 8 illustrates an example of reducing power consumption using zero gating in a systolic array.

FIG. 8 illustrates an example of reducing power consumption using zero gating in a systolic array.

Referring to FIG. 8, an encoding circuit of a control apparatus may separately compress input data for a current layer and weight data of the current layer depending on a range of reuse.

Figure 9:
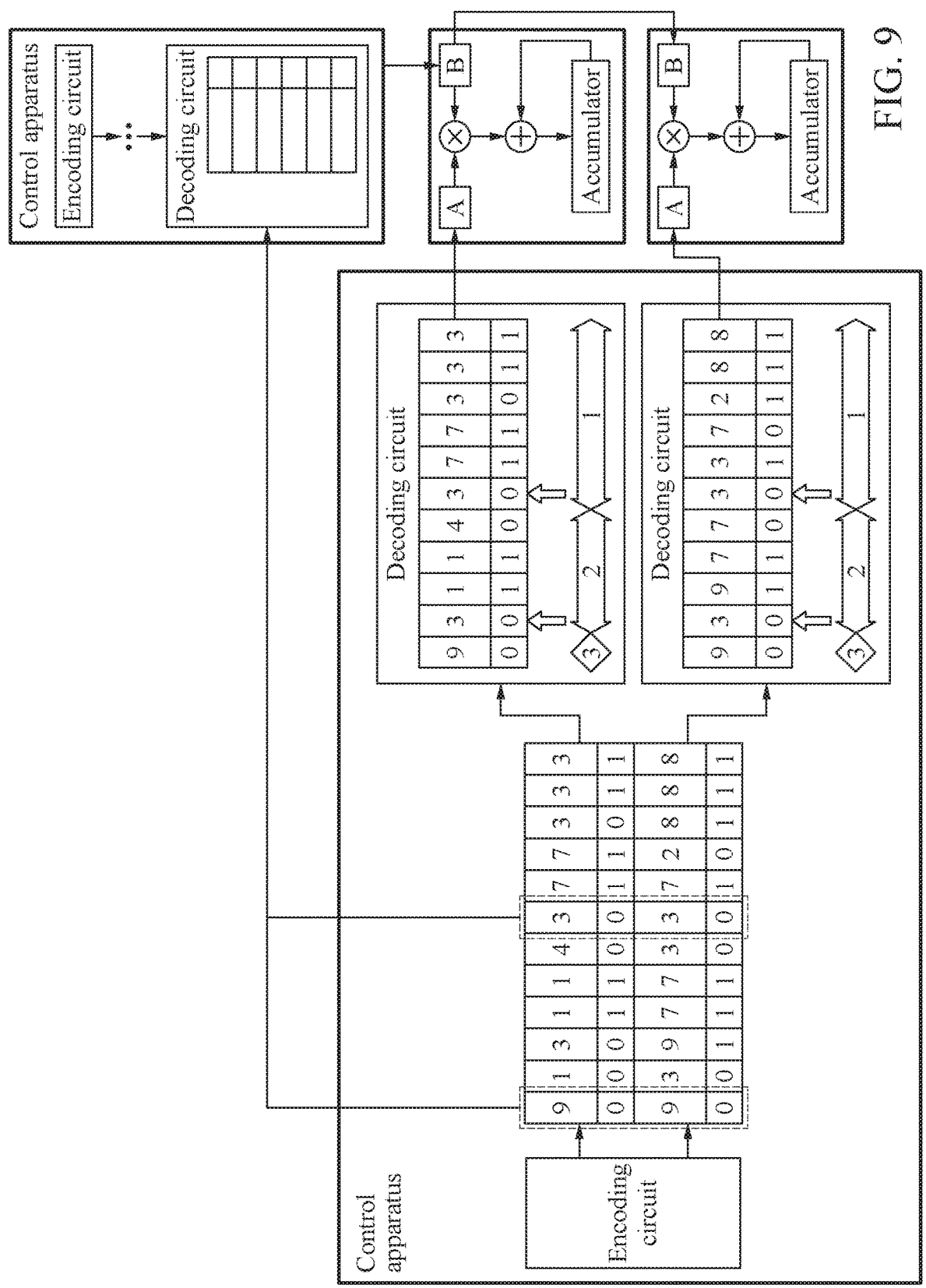
FIG. 9 illustrates an example of controlling data input and output when data are stored in parallel.

FIG. 9 illustrates an example of controlling data input and output when data are stored in parallel.

Referring to FIG. 9, in a case of a memory with a great data bit width, data may be stored in parallel. The data stored in parallel may be highly likely to include different numbers of consecutive "0"s at the same address, and thus a decoding circuit may insert a dummy value to match the data to a sequence with a longest range.

Through this, the neural network circuit may omit an operation with respect to non-consecutive invalid bits in common for the data stored in parallel.

Figure 10:
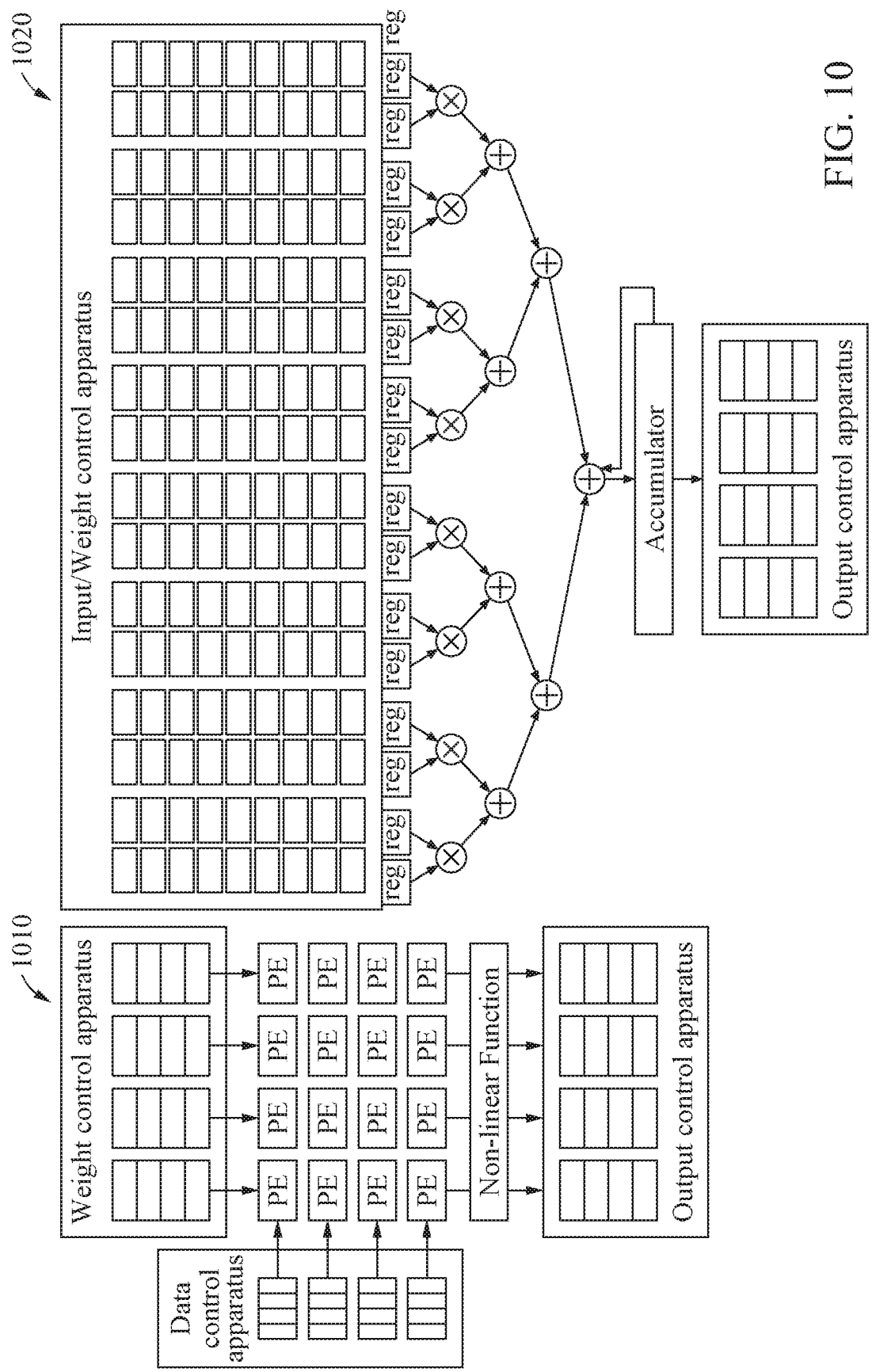
FIG. 10 illustrates an example of application of a method of controlling data input and output.

FIG. 10 illustrates an example of application of a method of controlling data input and output.

The method of controlling data input and output may be applicable to all schemes of sequentially reading consecutive data.

Referring to FIG. 10, a control method of a control apparatus that is connected to a neural network circuit performing a deep learning operation to control data input and output may also applicable to a systolic array 1010.

Further, the control method of the control apparatus that is connected to the neural network circuit performing a deep learning operation to control data input and output may also applicable to an adder tree architecture 1020.

The control apparatuses, memories, encoding circuits, decoding circuits, neural network circuits, systolic arrays, adder tree architectures, address counters, accumulators, data control apparatuses, weight control apparatuses, input/weight control apparatuses, output control apparatuses, control apparatus 200, memory 210, encoding circuit 220, decoding circuit 230, neural network circuit 240, control apparatus 420, encoding circuit 421, decoding circuit 423, neural network circuit 440, decoding circuit 510, neural network circuit 520, systolic array 1010, adder tree architecture 1020, apparatuses, units, modules, devices, and other components described herein with respect to FIGS. 1-13 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A neural network deep learning data control apparatus comprising:
   a memory;
   an encoding circuit configured to
      receive a data sequence,
      generate a compressed data sequence in which consecutive invalid bits in a bit string of the data sequence are compressed into a single bit of the compressed data sequence,
      generate a validity determination sequence indicating a valid bit and an invalid bit in a bit string of the compressed data sequence, and
      write the compressed data sequence and the validity determination sequence to the memory; and
   a decoding circuit configured to
      read the compressed data sequence and the validity determination sequence from the memory, and
      determine a bit in the bit string of the compressed data sequence set for transmission to a neural network circuit, based on the validity determination sequence, such that the neural network circuit omits an operation with respect to non-consecutive invalid bits.

2. The apparatus of claim 1, wherein the single bit of the compressed data sequence indicates a number of the consecutive invalid bits in the bit string of the data sequence.

3. The apparatus of claim 1, wherein
   the decoding circuit comprises a buffer configured to sequentially store the compressed data sequence and the validity determination sequence, and
   the decoding circuit is further configured to store a first pointer indicating a location at which a current bit of the compressed data sequence to be transmitted to the neural network circuit is stored in the buffer, and a second pointer indicating a location at which a next bit of the compressed data sequence to be transmitted to the neural network circuit at a next cycle of the current bit is stored in the buffer.

4. The apparatus of claim 3, wherein, for the determining of the bit set for transmission to the neural network circuit, the decoding circuit is further configured to:
   determine whether the current bit corresponding to the first pointer is valid based on the validity determination sequence;
   skip transmitting the current bit to the neural network circuit in response to the current bit being invalid; and
   transmit the current bit to the neural network circuit in response to the current bit being valid.

5. The apparatus of claim 3, wherein the decoding circuit is further configured to:
   determine whether the next bit corresponding to the second pointer is valid based on the validity determination sequence;
   move the first pointer to the location at which the next bit is stored in the buffer in response to the next bit being valid; and
   move the first pointer to a location at which a bit to be transmitted to the neural network circuit at a next cycle of the next bit is stored in the buffer in response to the next bit being invalid.

6. The apparatus of claim 3, wherein the decoding circuit is further configured to:
- determine whether the next bit corresponding to the second pointer is valid based on the validity determination sequence;
- move the second pointer to a location at which a bit to be transmitted to the neural network circuit at a next cycle of the next bit is stored in the buffer in response to the next bit being valid; and
- move the second pointer to a location at which a bit to be transmitted to the neural network circuit at an after-next cycle of the next bit is stored in the buffer in response to the next bit being invalid.

7. The apparatus of claim 1, wherein the decoding circuit is further configured to determine to jump an operation processing of the neural network circuit based on the validity determination sequence.

8. The apparatus of claim 3, wherein the decoding circuit is further configured to determine whether to jump an operation processing of the neural network circuit based on the next bit corresponding to the second pointer.

9. The apparatus of claim 3, wherein the decoding circuit is further configured to:
- determine whether the next bit corresponding to the second pointer is valid based on the validity determination sequence;
- skip jumping an operation processing of the neural network circuit in response to the next bit being valid; and
- jump the operation processing of the neural network circuit in response to the next bit being invalid.

10. The apparatus of claim 9, wherein the decoding circuit is further configured to jump the operation processing of the neural network circuit by a bit value of the next bit in response to the next bit being invalid.

11. The apparatus of claim 9, wherein the decoding circuit is further configured to jump the operation processing of the neural network circuit by a value obtaining by adding a value of 1 to a bit value of the next bit, in response to the next bit being invalid.

12. The apparatus of claim 3, wherein the decoding circuit is further configured to store a third pointer indicating a location at which the compressed data sequence and the validity determination sequence are to be stored in the buffer.

13. The apparatus of claim 1, wherein the valid bit is a bit having a bit value greater than a predetermined threshold value, and the invalid bit is a bit having a bit value less than or equal to the predetermined threshold value.

14. The apparatus of claim 1, wherein a bit value at a location in the validity determination sequence corresponding to a location of a valid bit in the compressed data sequence is "1", and a bit value at a location in the validity determination sequence corresponding to a location of an invalid bit in the compressed data sequence is "0".

15. The apparatus of claim 1, wherein the decoding circuit is further configured to use the validity determination sequence as a clock gating signal to perform an operation of the neural network circuit.

16. The apparatus of claim 3, wherein the buffer comprises a ring buffer.

17. The apparatus of claim 1, wherein the encoding circuit is further configured to generate the compressed data sequence by compressing consecutive valid bits having the same bit value in the bit string of the data sequence into another single bit of the compressed data sequence.

18. The apparatus of claim 1, wherein the decoding circuit is further configured to store a fourth pointer for identifying a plurality of reused data in response to the data sequence including the plurality of reused data.

19. The apparatus of claim 1, wherein the decoding circuit is further configured to add a bit for a plurality of compressed data sequences to have a same length, when reading the plurality of compressed data sequences in parallel.

20. The apparatus of claim 1, wherein the data sequence indicates connection strengths of edges between nodes of a neural network of the neural network circuit.

21. The apparatus of claim 20, further comprising the neural network circuit, wherein the neural network circuit is configured to train the neural network by redetermining one or more of the connection strengths for a dropout operation, in response to receiving the determined bit string of the compressed data sequence.

22. A processor-implemented neural network deep learning data control method comprising:
- receiving a data sequence;
- generating a compressed data sequence in which consecutive invalid bits in a bit string of the data sequence are compressed into a single bit of the compressed data sequence;
- generating a validity determination sequence to determine a valid bit and an invalid bit in a bit string of the compressed data sequence;
- writing the compressed data sequence and the validity determination sequence to a memory;
- reading the compressed data sequence and the validity determination sequence from the memory; and
- determining a bit in the bit string of the compressed data sequence set for transmission to a neural network circuit, based on the validity determination sequence, such that the neural network circuit omits an operation with respect to non-consecutive invalid bits.

23. The method of claim 22, wherein the single bit of the compressed data sequence indicates a number of the consecutive invalid bits in the bit string of the data sequence.

24. The method of claim 22, further comprising:
- sequentially storing the compressed data sequence and the validity determination sequence; and
- storing a first pointer indicating a location at which a current bit of the compressed data sequence to be transmitted to the neural network circuit is stored in the buffer, and a second pointer indicating a location at which a next bit of the compressed data sequence to be transmitted to the neural network circuit at a next cycle of the current bit is stored in the buffer.

25. The method of claim 24, wherein the determining comprises:
- determining whether the current bit corresponding to the first pointer is valid based on the validity determination sequence;
- skipping transmitting the current bit to the neural network circuit in response to the current bit being invalid; and
- transmitting the current bit to the neural network circuit in response to the current bit being valid.

26. The method of claim 24, further comprising:
- determining whether the next bit corresponding to the second pointer is valid based on the validity determination sequence;
- moving the first pointer to the location at which the next bit is stored in the buffer in response to the next bit being valid; and
- moving the first pointer to a location at which a bit to be transmitted to the neural network circuit at a next cycle of the next bit is stored in the buffer in response to the next bit being invalid.

27. The method of claim 24, further comprising:
   determining whether the next bit corresponding to the second pointer is valid based on the validity determination sequence;
   moving the second pointer to a location at which a bit to be transmitted to the neural network circuit at a next cycle of the next bit is stored in the buffer in response to the next bit being valid; and
   moving the second pointer to a location at which a bit to be transmitted to the neural network circuit at an after-next cycle of the next bit is stored in the buffer in response to the next bit being invalid.

28. The method of claim 24, further comprising:
   determining whether to jump an operation processing of the neural network circuit based on the next bit corresponding to the second pointer.

29. The method of claim 24, further comprising:
   determining whether the next bit corresponding to the second pointer is valid based on the validity determination sequence;
   skipping jumping an operation processing of the neural network circuit in response to the next bit being valid; and
   jumping the operation processing of the neural network circuit in response to the next bit being invalid.

30. The method of claim 29, wherein the jumping comprises jumping the operation processing of the neural network circuit by a bit value of the next bit in response to the next bit being invalid.

31. The method of claim 24, further comprising:
   storing a third pointer indicating a location at which the compressed data sequence and the validity determination sequence are to be stored in the buffer.

32. The method of claim 22, wherein the generating comprises generating the compressed data sequence by compressing consecutive valid bits having the same bit value in the bit string of the data sequence into another single bit of the compressed data sequence.

33. The method of claim 22, further comprising:
   storing a fourth pointer for identifying a plurality of reused data in response to the data sequence including the plurality of reused data.

34. The method of claim 22, further comprising:
   adding a bit for a plurality of compressed data sequences to have a same length, when reading the plurality of compressed data sequences in parallel.

35. A non-transitory computer-readable storage medium storing instructions that, when executed by a processor, configure the processor to perform the method of claim 22.

36. A processor-implemented neural network data control method comprising:
   receiving a data sequence indicating connection strengths of connections between nodes of a neural network;
   generating a compressed data sequence comprising a bit of the data sequence that is greater than a threshold and a bit having a value determined based on a number of consecutive bits of the data sequence that are less than or equal to the threshold; and
   training the neural network by performing a dropout operation of the one or more connections based on the compressed data sequence.

* * * * *